US012581821B2

(12) United States Patent
Xue et al.

(10) Patent No.: US 12,581,821 B2
(45) Date of Patent: Mar. 17, 2026

(54) DISPLAY PANEL WITH DEFORMABLE BRIDGING UNIT, MANUFACTURING METHOD THEREOF, AND DISPLAY DEVICE

(71) Applicant: BOE Technology Group Co., Ltd., Beijing (CN)

(72) Inventors: Jinxiang Xue, Beijing (CN); Zhongyuan Sun, Beijing (CN); Lu Wang, Beijing (CN); Fang Liu, Beijing (CN); Teng Qi, Beijing (CN); Guangcai Yuan, Beijing (CN); Che An, Beijing (CN); Jingkai Ni, Beijing (CN); Wenqi Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 411 days.

(21) Appl. No.: 18/249,189

(22) PCT Filed: Feb. 25, 2022

(86) PCT No.: PCT/CN2022/078039
§ 371 (c)(1),
(2) Date: Apr. 14, 2023

(87) PCT Pub. No.: WO2023/159498
PCT Pub. Date: Aug. 31, 2023

(65) Prior Publication Data
US 2025/0089484 A1 Mar. 13, 2025

(51) Int. Cl.
*H10K 59/131* (2023.01)
*H10K 59/12* (2023.01)
*H10K 102/00* (2023.01)
(52) U.S. Cl.
CPC ....... *H10K 59/131* (2023.02); *H10K 59/1201* (2023.02); *H10K 2102/311* (2023.02)

(58) Field of Classification Search
CPC ............. H10K 59/131; H10K 59/1201; H10K 2102/311; H10K 59/00; H10K 77/111; G09F 9/30; H10D 86/00
See application file for complete search history.

(56) References Cited

U.S. PATENT DOCUMENTS

| | | | |
|---|---|---|---|
| 7,659,145 | B2 | 2/2010 | Do et al. |
| 8,080,882 | B2 | 12/2011 | Do et al. |

(Continued)

FOREIGN PATENT DOCUMENTS

| | | |
|---|---|---|
| CN | 107731866 A | 2/2018 |
| CN | 107731886 A | 2/2018 |

(Continued)

OTHER PUBLICATIONS

Machine Translation of CM 113451329.*

(Continued)

*Primary Examiner* — J.E. Schoenholtz
(74) *Attorney, Agent, or Firm* — Calfee, Halter & Griswold LLP

(57) ABSTRACT

The disclosure provides a display panel, a manufacturing method thereof, and a display device, which belong to the field of display technology. The display panel includes a plurality of display islands (SPXL) and a plurality of deformable bridging units (SBRI); the plurality of display islands (SPXL) are separated from each other; and two adjacent display islands (SPXL) are connected by the bridging units (SBRI); the display island (SPXL) has at least one display unit (Upxl); and the bridging unit (SBRI) has an external signal wiring electrically connected to the display unit (Upxl).

17 Claims, 26 Drawing Sheets

(56)  References Cited

U.S. PATENT DOCUMENTS

| | | | | |
|---|---|---|---|---|
| 10,310,560 B2 * | 6/2019 | Choi | ..................... | H05B 33/14 |
| 10,649,496 B2 | 5/2020 | Choi et al. | | |
| 2010/0007029 A1 | 1/2010 | Do et al. | | |
| 2010/0096731 A1 | 4/2010 | Do et al. | | |
| 2018/0046221 A1 * | 2/2018 | Choi | ..................... | H05B 33/22 |
| 2019/0258297 A1 | 8/2019 | Choi et al. | | |
| 2020/0410909 A1 * | 12/2020 | Jung | ................... | H10K 59/873 |
| 2021/0134196 A1 | 5/2021 | Niu et al. | | |
| 2022/0013599 A1 * | 1/2022 | Hong | ................... | H10K 59/353 |
| 2022/0059577 A1 * | 2/2022 | Pan | ..................... | H10D 86/443 |
| 2022/0299385 A1 * | 9/2022 | Tee | ......................... | G01L 1/146 |
| 2022/0328604 A1 | 10/2022 | Yang et al. | | |

FOREIGN PATENT DOCUMENTS

| | | | | | |
|---|---|---|---|---|---|
| CN | 107994052 A | | 5/2018 | | |
| CN | 109817687 A | | 5/2019 | | |
| CN | 111210726 A | | 5/2020 | | |
| CN | 112863340 A | | 5/2021 | | |
| CN | 113451329 A | * | 9/2021 | ............ | H10D 86/60 |
| CN | 113451379 A | | 9/2021 | | |
| CN | 109817687 B | | 10/2021 | | |
| CN | 113471223 A | | 10/2021 | | |
| CN | 113629066 A | | 11/2021 | | |
| KR | 20200008081 A | | 1/2020 | | |
| TW | I230427 B | | 4/2005 | | |
| TW | 200601474 A | | 1/2006 | | |
| WO | 2022151528 A1 | | 7/2022 | | |

OTHER PUBLICATIONS

Written Opinion from PCT/CN2022/078039 dated Nov. 18, 2022.
International Search Report from PCT/CN2022/078039 dated Nov. 18, 2022.

* cited by examiner

SPXL

HC

HSTR

SBRI

HC

SBRI

SPXL

OUTL

HSTR

SPXL

HSTR

SBRI

HC

HC

SBRI

SPXL

OUTL

HSTR

CPX

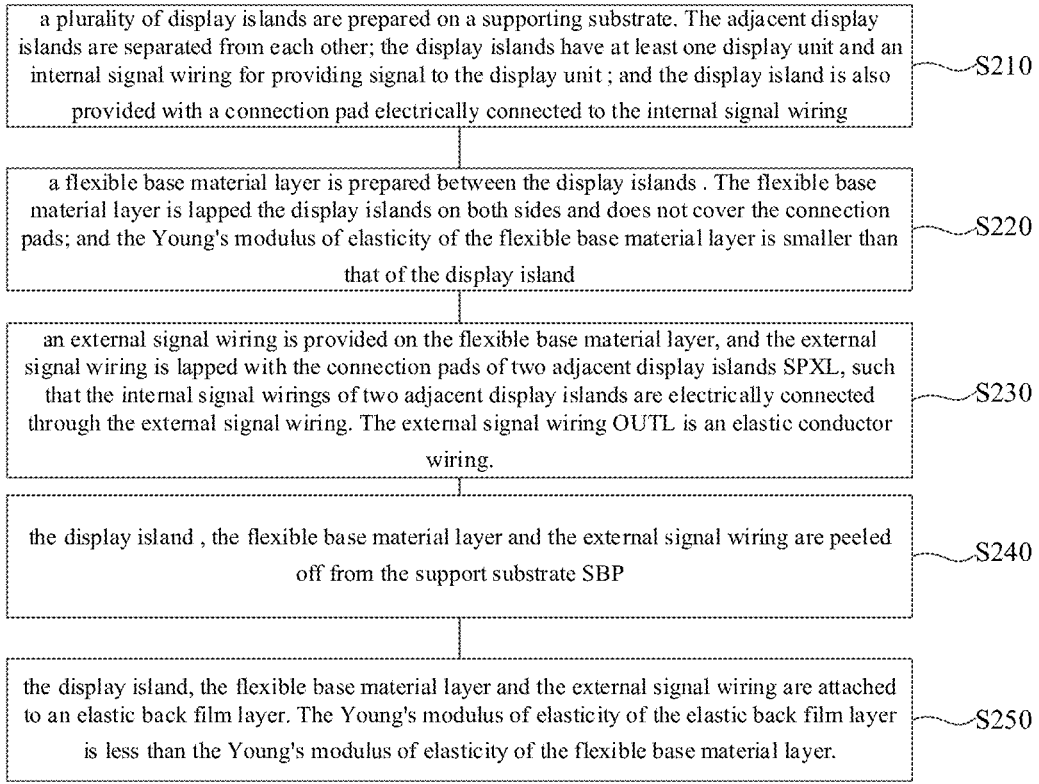

a plurality of display islands are prepared on a supporting substrate. The adjacent display islands are separated from each other; the display islands have at least one display unit and an internal signal wiring for providing signal to the display unit ; and the display island is also provided with a connection pad electrically connected to the internal signal wiring          S210 a flexible base material layer is prepared between the display islands . The flexible base material layer is lapped the display islands on both sides and does not cover the connection pads; and the Young's modulus of elasticity of the flexible base material layer is smaller than that of the display island          S220 an external signal wiring is provided on the flexible base material layer, and the external signal wiring is lapped with the connection pads of two adjacent display islands SPXL, such that the internal signal wirings of two adjacent display islands are electrically connected through the external signal wiring. The external signal wiring OUTL is an elastic conductor wiring.          S230 the display island , the flexible base material layer and the external signal wiring are peeled off from the support substrate SBP          S240 the display island, the flexible base material layer and the external signal wiring are attached to an elastic back film layer. The Young's modulus of elasticity of the elastic back film layer is less than the Young's modulus of elasticity of the flexible base material layer.          S250

FIG. 62

DISPLAY PANEL WITH DEFORMABLE BRIDGING UNIT, MANUFACTURING METHOD THEREOF, AND DISPLAY DEVICE

CROSS REFERENCE

The present application is based upon International Application No. PCT/CN2022/078039, filed on Feb. 25, 2022, and the entire contents thereof are incorporated herein by reference.

TECHNICAL FIELD

The present disclosure relates to the field of display technology, in particular, to a display panel, a manufacturing method thereof, and a display device.

BACKGROUND

A stretchable display device that can change its shape is one of the future development directions of display technology.

It should be noted that, information disclosed in the above background portion is provided only for better understanding of the background of the present disclosure, and thus it may contain information that does not form the prior art known by those ordinary skilled in the art.

SUMMARY

According to a first aspect of the present disclosure, there is provided a display panel, including a plurality of display islands and a plurality of deformable bridging units, wherein the plurality of display islands are separated from each other, and adjacent two of the bridging islands are connected through the bridging unit; and wherein each display island includes at least one display unit, and each bridging unit includes an external signal wiring electrically connected to the display unit.

According to an implementation of the present disclosure, the bridging unit is provided with at least one stress relief hole.

According to an implementation of the present disclosure, the stress relief hole is a hollow hole.

According to an implementation of the present disclosure, the stress relief hole is a circular hole, an elliptical hole or a long hole, and wherein a middle line of the long hole is parallel to a middle line of the bridging unit.

According to an implementation of the present disclosure, at least one of the long holes is configured to run through the bridging unit along the extending direction of the bridging unit.

According to an implementation of the present disclosure, at least one set of stress relief holes is provided on the bridging unit, and each set of stress relief holes includes a plurality of stress relief holes arranged in sequence; and wherein an arrangement track of each stress relief hole in each group of stress relief holes is parallel to a middle line of the bridging unit.

According to an implementation of the present disclosure, each stress relief hole in at least one set of stress relief holes is sequentially merged into one long hole.

According to an implementation of the present disclosure, the bridging unit includes a bending area, and wherein at least a part of the stress relief hole is disposed in the bending area.

According to an implementation of the present disclosure, the bending area is divided into a plurality of wiring areas by the stress release hole, and the external signal wiring is arranged in each of the wiring areas;

each of the wiring regions includes an inner edge adjacent to a concave side edge of the bending area and an outer edge adjacent to a convex side edge of the bending area; and in at least a part of the wiring area, a distance between the external signal wiring closest to the inner edge and the inner edge is greater than a distance between the external signal wiring closest to the outer edge and the outer edge.

According to an implementation of the present disclosure, the display panel includes a base substrate, a driving circuit layer and a pixel layer which are stacked in sequence; and wherein the display unit of the display island is formed in the driving circuit layer and the pixel layer on the base substrate; and the external signal wiring of the bridging unit is formed in the driving circuit layer on the base substrate.

According to an implementation of the present disclosure, the display island includes an internal signal wiring corresponding to the external signal wiring on an adjacent bridging unit, and includes a connection pad electrically connected to the internal signal wiring;

wherein the external signal wiring is lapped to the connection pad, so that the external signal wiring is electrically connected to the corresponding internal signal wiring; and wherein the external signal wiring is an elastic conductor wiring.

According to an implementation of the present disclosure, a material of the external signal wiring is a mixture of nano conductive material and elastic polymer, or one of PEDOT, liquid metal, and Mxene.

According to an implementation of the present disclosure, the connection pad is provided with at least one first reinforcing hole, and the external signal wiring at least partially covers the first reinforcing hole.

According to an implementation of the present disclosure, the first reinforcing hole is penetrated through the connection pad along a normal direction of the display panel.

According to an implementation of the present disclosure, along a normal direction of the display panel, the first reinforcing hole is penetrated through the connection pad and is extended away from the external signal wiring.

According to an implementation of the present disclosure, an inorganic medium layer is provided between the connection pad and the external signal wiring, and the inorganic medium layer is provided with a first reinforcing hole exposing at least a part region of the connection pad, and the external signal wiring is electrically connected to the connection pad through the first reinforcing hole; and wherein an adhesion between the inorganic medium layer and the connection pad is greater than an adhesion between the external signal wiring and the connection pad.

According to an implementation of the present disclosure, a protruding piece is provided on a surface of the connection pad close to the external signal wiring, and the external signal wiring covers the protruding piece and is electrically connected to the connection pad; and wherein an adhesion between the protruding piece and the connection pad is greater than an adhesion between the external signal wiring and the connection pad.

According to an implementation of the present disclosure, the bridging unit further includes a flexible base material layer, the flexible base material layer is lapped with the display island; and the flexible base material layer is overlapped with the external signal wiring.

According to an implementation of the present disclosure, the display island is provided with a lapping area at a position near an edge, and an end of the flexible base material layer is lapped on the lapping area.

According to an implementation of the present disclosure, the display island is thinned at the lapping area such that there is a step between the lapping area and an adjacent area.

According to an implementation of the present disclosure, the lapping area is located between the connection pad and the edge of the display island.

According to an implementation of the present disclosure, the display island is provided with a second reinforcing hole in the lapping area; and the flexible base material layer at least partially covers the second reinforcing hole.

According to an implementation of the present disclosure, at least one annular groove is provided along the edge of the display island; the annular groove is overlapped with the lapping area; and the lapping area covers at least a partial area of the annular groove.

According to an implementation of the present disclosure, the display panel further includes an elastic back film layer; the display islands and the bridging units are disposed on a same side of the elastic back film layer; Young's modulus of elasticity of the elastic back film layer is smaller than Young's modulus of elasticity of the display island.

According to an implementation of the present disclosure, the display island includes a base substrate, a driving circuit layer and a pixel layer which are stacked in sequence; and wherein the bridging unit includes a flexible base material layer and an external signal wiring; and the flexible base material layer and the base substrate are bonded to the elastic back film layer.

According to an implementation of the present disclosure, Young's modulus of elasticity of the external signal wiring is greater than Young's modulus of elasticity of the elastic back film layer.

According to a second aspect of the present disclosure, there is provided a display device, including a substrate and the above display panel, and the display panel being attached to the substrate.

According to a third aspect of the present disclosure, there is provided a method for manufacturing a display panel, including:

preparing a plurality of display islands on a support substrate, wherein adjacent display islands are separated from each other; each display island includes at least one display unit and an internal signal wiring providing signal to the display unit; and the display island is further provided with a connection pad electrically connected to the internal signal wiring;

preparing an external signal wiring between the display islands, wherein the external signal wiring is lapped with the connection pads of adjacent two display islands, such that the internal signal wirings of the adjacent two display islands are electrically connected by the external signal wiring, and the external signal wiring is an elastic conductor wiring;

peeling off the display island and the external signal wiring from the support substrate; and bonding the display island and the external signal wiring to an elastic back film layer, and Young's modulus of elasticity of the elastic back film layer is smaller than Young's modulus of elasticity of the display island.

According to a fourth aspect of the present disclosure, there is provided a method for manufacturing a display panel, including:

preparing a plurality of display islands on a support substrate, wherein adjacent display islands are separated from each other; each display island includes at least one display unit and an internal signal wiring providing signal to the display unit; and the display island is further provided with a connection pad electrically connected to the internal signal wiring;

preparing a flexible base material layer between the display islands, wherein the flexible base material layer is lapped with the display islands at both sides while does not cover the lapping pads, and Young's modulus of elasticity of the flexible base material layer is smaller than Young's modulus of elasticity of the display island;

preparing an external signal wiring on the flexible base material layer, wherein the external signal wiring is lapped with the connection pads of adjacent two display islands, such that the internal signal wirings of the adjacent two display islands are electrically connected by the external signal wiring, and the external signal wiring is an elastic conductor wiring;

peeling off the display island, the flexible base material layer and the external signal wiring from the support substrate; and bonding the display island, the flexible base material layer and the external signal wiring to an elastic back film layer, and Young's modulus of elasticity of the elastic back film layer is smaller than Young's modulus of elasticity of the flexible base material layer.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

FIG. 2-1 is a schematic structural diagram of a display panel in an embodiment of the present disclosure.

FIG. 2-2 is a schematic structural diagram of a display island of a display panel in an embodiment of the present disclosure.

FIG. 62 is a schematic flowchart of a method for manu-facturing a display panel in an embodiment of the present disclosure.

DETAILED DESCRIPTION

Figure 1:
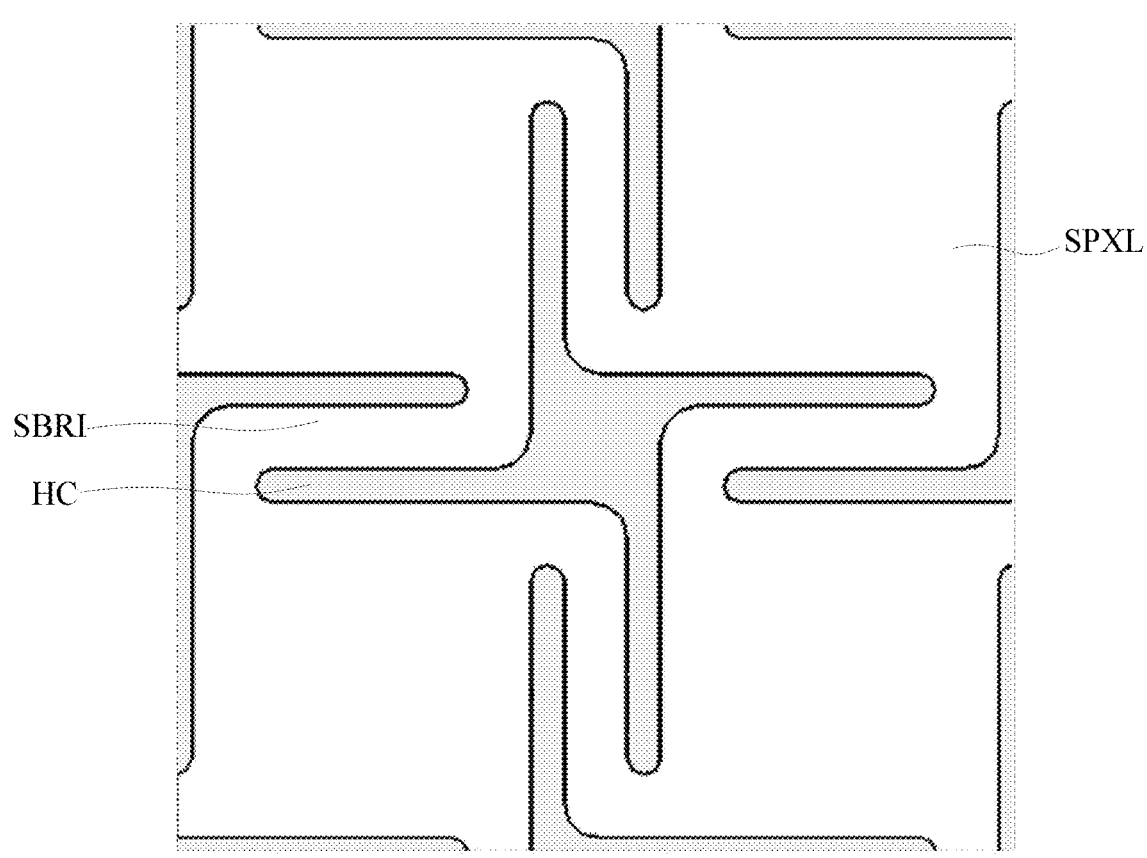
FIG. 1 is a schematic structural diagram of a display panel in an embodiment of the present disclosure.

Example embodiments will now be described more fully with reference to the accompanying drawings. Example embodiments may, however, be embodied in many forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted. Furthermore, the drawings are merely schematic illustrations of the present disclosure and are not necessarily drawn to scale.

Although relative terms such as "upper" and "lower" are used in this specification to describe the relative relationship of one component of an icon to another component, these terms are used in this specification only for convenience, for example, according to the direction of the example illus-trated in the accompanying drawings. It will be appreciated that if the illustrated device is turned over so that it is upside down, then elements described as being "upper" will become elements that are "lower". When a structure is "on" another structure, it may mean that a structure is integrally formed on another structure, or that a structure is "directly" placed on another structure, or that a structure is "indirectly" placed on the other structure through another structure.

The terms "a", "an", "the", "said" and "at least one" are used to indicate the presence of one or more elements/ components/etc.; the terms "comprising" and "have" are used to indicate an open-ended inclusion, and means that there may be additional elements/components/etc., in addi-tion to the listed elements/components/etc, which is not a limitation on the number of the objects.

The disclosure provides a display panel and a display device using the display panel. Referring to FIG. 1 and FIG.

2-1, the display panel includes a plurality of display islands SPXL and a plurality of deformable bridging units SBRI; the plurality of display islands SPXL are separated from each other; two adjacent display islands SPXL are connected through the bridging unit SBRI; the display island SPXL has at least one display unit Upxl; and the bridging unit SBRI has an external signal wiring OUTL electrically connected to the display unit Upxl.

When an external force is applied to the display panel to stretch the display panel, the shape of the bridging unit SBRI can be changed so that the interval between the display islands SPXL can be enlarged, so that the display panel can be adapted to different substrates, for example, it can deform according to the shape of the two-dimensional or three-dimensional substrate. In one embodiment of the present disclosure, the display device may include a substrate and a display panel attached to the substrate. Further, the display device may have a two-dimensional or three-dimensional display surface.

In this disclosure, the deform of the bridging unit SBRI can refer to the change of the attitude of the bridging unit SBRI (such as the relative position and relative angle between the local position and the display island SPXL), or the change of the length of the bridging unit, or the change in both the length of the SBRI and the attitude of the bridging unit SBRI.

As follows, the structure, principle and effect of the display panel of the present disclosure will be further introduced and illustrated in conjunction with the accompa-nying drawings.

Figures 1, 2:
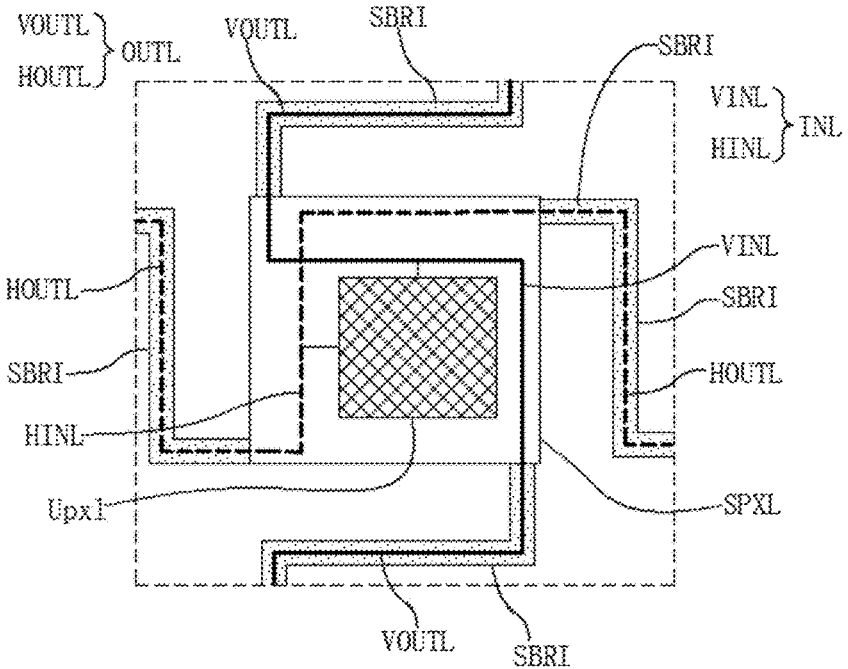
Figure 2:
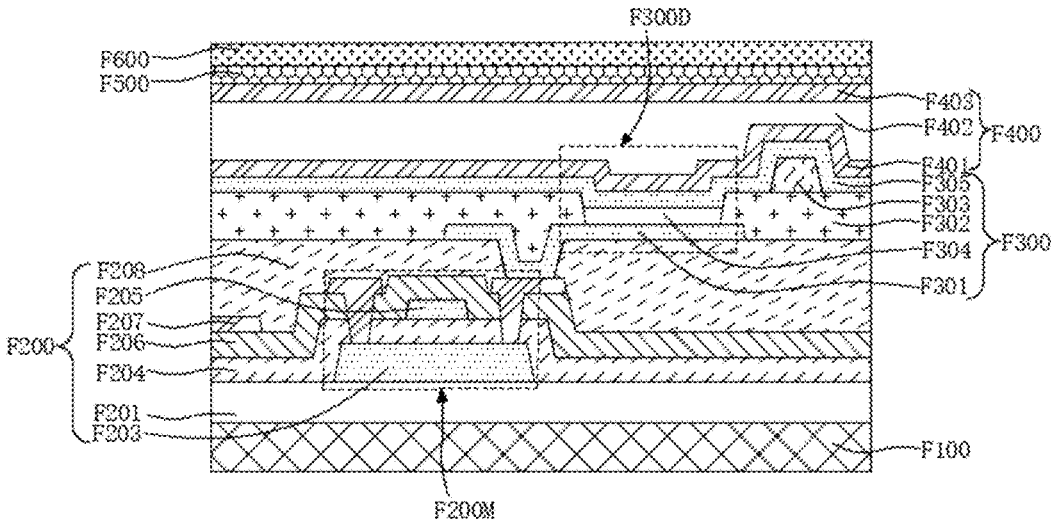

Referring to FIG. 2-1, the display island SPXL includes at least one display unit Upxl, and the display unit Upxl includes a light-emitting element and a pixel drive circuit for driving the light-emitting element. In the display island SPXL, there is also an internal signal wiring INL electrically connected to the display unit Upxl, and the internal signal wiring INL is electrically connected to the external signal wiring OUTL. In this way, the signal driving the display unit Upxl can be loaded to the display unit Upxl through the external signal wiring OUTL and the internal signal wiring INL. In one embodiment of the present disclosure, the display island SPXL at least includes an internal signal column wiring VINL and an internal signal row wiring HINL; the internal signal column wiring VINL is used to load the column drive signal to the display unit Upxl, for example, load driving data and/or driving voltage. The internal signal row wiring HINL is used for loading row driving signals, such as scanning signals, to the display unit Upxl. Correspondingly, one display island SPXL is con-nected with four bridging units SBRI, including two oppo-site row bridging units SBRI and two opposite column bridging units SBRI. The external signal wiring OUTL in the two row bridging units SBRI are used as the external signal row wiring HOUTL to be electrically connected to both ends of the internal signal row wiring HINL respectively, and the external signal wiring OUTL in the two column bridging units SBRI are used as external signal column wiring VOUTL to be electrically connected to both ends of the internal signal column wiring VINL respectively.

Referring to FIG. 2, the display island SPXL may include a base subtract F100, a driving circuit layer F200 and a pixel layer F300 which are sequentially stacked. Wherein, the pixel layer is provided with light-emitting elements serving as sub-pixels, and the pixel driving circuit layer is provided with a pixel driving circuit for driving the sub-pixels.

The base substrate F100 may be a base substrate F100 of an organic material, for example, the material of the base substrate F100 may be polyimide (PI). Of course, the material of the base substrate can also be selected from other organic materials as required, or an inorganic layer can be interposed.

The driving circuit layer F200 is provided with pixel driving circuits for driving sub-pixels. In the driving circuit layer F200, any pixel driving circuit may include a transistor F200M and a storage capacitor. Further, the transistor F200M can be a thin film transistor, and the thin film transistor can be selected from a top-gate thin film transistor, a bottom-gate thin film transistor or a double-gate thin film transistor. The material of the active layer of the thin film transistor can be an amorphous silicon semiconductor material, a low temperature Polysilicon semiconductor material, a metal oxide semiconductor material, an organic semiconductor material or other types of semiconductor materials. The thin film transistors can be N-type thin film transistors or P-type thin film transistors.

It can be understood that, among the respective transistors in the pixel driving circuit, the types of any two transistors may be the same or different. Exemplarily, in an implementation manner, in a pixel driving circuit, some transistors may be N-type transistors and some transistors may be P-type transistors. As another example, in another embodiment of the present disclosure, in a pixel driving circuit, the material of the active layer of some transistors may be a low-temperature polysilicon semiconductor material, and the material of the active layer of some transistors may be a metal oxide semiconductor material. In some embodiments of the present disclosure, the thin film transistor is a low temperature polysilicon transistor. In other embodiments of the present disclosure, part of the thin film transistors are low temperature polysilicon transistors, and part of the thin film transistors are metal oxide transistors.

Optionally, the driving circuit layer F200 may include a semiconductor layer F203, a gate insulating layer F204, a gate layer F205, an interlayer dielectric layer F206, and a source-drain metal layer F207 stacked between the base substrate F100 and the pixel layer F300. Each thin film transistor and storage capacitor can be formed of film layers such as semiconductor layer F203, gate insulating layer F204, gate layer F205, interlayer dielectric layer F206, and source-drain metal layer F207. Wherein, the positional relationship of each film layer can be determined according to the film layer structure of the thin film transistor. Further, the semiconductor layer F203 can be used to form the channel region of the transistor. The gate layer can be used to form the gate layer wiring such as the scan line, the reset control line, and the light emission control line, can also be used to form the gate of the transistor, and can also be used to form part or all of the electrode plates of the storage capacitor. The source-drain metal layer can be used to form data line, drive power line and other source-drain metal layer wiring, and can also be used to form part of the electrode plates of the storage capacitor.

For example, in some embodiments of the present disclosure, the driving circuit layer F200 may include a semiconductor layer F203, a gate insulating layer F204, a gate layer F205, an interlayer dielectric layer F206, and a source-drain metal layer F207, which are sequentially stacked. The thin film transistor thus formed is a top-gate thin film transistor.

For another example, in some embodiments of the present disclosure, the driving circuit layer F200 may include a gate layer F205, a gate insulating layer F204, a semiconductor layer F203, an interlayer dielectric layer F206, and a source-drain metal layer F207 stacked in sequence. The thin film transistor thus formed is a bottom gate thin film transistor.

In some embodiments, the gate layer may be two or three layers. For example, in one embodiment of the present disclosure, the gate layer F205 may include a first gate layer and a second gate layer, and the gate insulating layer F204 may include a first gate insulating layer for isolating the semiconductor layer F203 and the first gate layer, and a second gate insulating layer for isolating the first gate layer and the second gate layer. Exemplarily, the driving circuit layer F200 may include a semiconductor layer F203, a first gate insulating layer, a first gate layer, a second gate insulating layer, and a second gate layer, an interlayer dielectric layer F206 and a source-drain metal layer F207 stacked on one side of the base substrate F100 in sequence. For another example, in an embodiment of the present disclosure, the gate layer F205 may include a first gate layer and a second gate layer, and the semiconductor layer F203 may be interposed between the first gate layer and the second gate layer. The gate insulating layer F204 may include a first gate insulating layer for isolating the semiconductor layer F203 from the first gate layer, and a second gate insulating layer for isolating the second gate layer from the semiconductor layer F203. Exemplarily, in one embodiment of the present disclosure, the driving circuit layer F200 may include a first gate layer, a first gate insulating layer, a semiconductor layer F203, a second gate insulating layer, a second gate layer, an interlayer dielectric layer F206 and a source-drain metal layer F207 stacked on one side of the base substrate F100 in sequence. In this way, a transistor having a double gate structure can be formed. For another example, in an embodiment of the present disclosure, the semiconductor layer F203 may include a low-temperature polysilicon semiconductor layer and a metal oxide semiconductor layer; the gate layer includes a first gate layer and a second gate layer, and the gate insulation layer includes a first gate insulating layer and a second gate insulating layer. The driving circuit layer F200 may include a low-temperature polysilicon semiconductor layer, a first gate insulating layer, a first gate layer, a metal oxide semiconductor layer, a second gate insulating layer, a second gate layer, an interlayer dielectric layer F206 and a source-drain metal layer F207 stacked on one side of the base substrate F100 in sequence. For another example, in an embodiment of the present disclosure, the semiconductor layer F203 may include a low-temperature polysilicon semiconductor layer and a metal oxide semiconductor layer; the gate layer includes first to third gate layers, and the gate insulating layer includes the first to third gate insulating layers. The driving circuit layer F200 may include a low-temperature polysilicon semiconductor layer, a first gate insulating layer, a first gate layer, an insulating buffer layer, a second gate layer, and a second gate insulating layer, a metal oxide semiconductor layer, a third gate insulating layer, a third gate layer, an interlayer dielectric layer F206, and a source-drain metal layer F207 stacked on one side of the base substrate F100 in sequence.

In some embodiments, the source-drain metal layer may be two or three layers. For example, in one embodiment of the present disclosure, the source-drain metal layer may include a first source-drain metal layer and a second source-drain metal layer stacked on the side of the interlayer dielectric layer F206 away from the base substrate in sequence. An insulating layer, such as a passivation layer and/or a planarization layer, may be interposed between the first source-drain metal layer and the second source-drain metal layer. For another example, in an embodiment of the present disclosure, the source-drain metal layer may include a first source-drain metal layer, a second source-drain metal layer, and a third source-drain metal layer stacked on the side of the interlayer dielectric layer F206 away from the base substrate in sequence. An insulating layer, such as a passivation layer and/or a resin layer, may be interposed between the first source-drain metal layer and the second source-drain metal layer; and an insulating layer, such as a passivation layer and/or a planarization layer, may be interposed between the second source-drain metal layer and the third source-drain metal layer.

Optionally, the driving circuit layer F200 may further include a passivation layer, and the passivation layer may be disposed on the surface of the source-drain metal layer F207 away from the base substrate F100 to protect the source-drain metal layer F207.

Optionally, the F201 driving circuit layer F200 may further include a buffer material layer F201 disposed between the base substrate F100 and the semiconductor layer F203, and the semiconductor layer F203, the gate layer F205, etc., are located at the side of the buffer material layer away from the base substrate F100. The material of the buffer material layer may be inorganic insulating materials such as silicon oxide and silicon nitride. The buffer material layer can be a layer of inorganic material, or inorganic material stacked in multiple layers.

Optionally, the driving circuit layer F200 may further include a planarization layer F208 located between the source-drain metal layer F207 and the pixel layer F300, and the planarization layer F208 may provide a planarized surface for the pixel electrode. Optionally, the material of the planarization layer F208 may be an organic material.

In one embodiment of the present disclosure, the internal signal row wiring HINL is formed in the gate layer, and is used for loading row signals to the pixel driving circuit, such as one or more of loading scan signals, light emission control signals, reset control signals, reset power supply voltage and other signals.

In an embodiment of the present disclosure, the internal signal column wiring VINL can be formed on the source-drain metal layer, and is used to load the column signal to the pixel driving circuit, for example, such as one or more of driving data signal, driving power supply voltage signal and the like.

In one embodiment of the present disclosure, the internal signal column wiring VINL is also used to load the common voltage to the sub-pixels.

The pixel layer F300 is provided with light-emitting elements distributed in an array, and each light-emitting element emits light under the control of the pixel driving circuit. In the present disclosure, the light-emitting element may be an organic electroluminescence diode (OLED), a micro light-emitting diode (Micro LED), a quantum dot-organic electroluminescence diode (QD-OLED), a quantum dot light-emitting diode (QLED) or other types of light-emitting elements. Exemplarily, in one embodiment of the present disclosure, the light emitting element is an organic electroluminescence diode (OLED), and the display panel is an OLED display panel. Hereinafter, a possible structure of the pixel layer is exemplarily introduced, taking the light-emitting element as an organic electroluminescence diode as an example.

Optionally, the pixel layer F300 may be disposed on the side of the driving circuit layer F200 away from the base substrate F100, which may include a pixel electrode layer F301, a pixel definition layer F302, a support pillar layer F303, and an organic light-emitting functional layer F304 and a common electrode layer F305 stacked in sequence.

The pixel island includes a display area provided with sub-pixels and an encapsulation area surrounding the display area. The encapsulation area is used to block the intrusion of external water and oxygen to the display area. Wherein, the pixel electrode layer F301 has a plurality of pixel electrodes; the pixel definition layer F302 has a plurality of penetrating pixel openings corresponding to the plurality of pixel electrodes in the display area, and any pixel opening exposes at least part of the corresponding pixel electrode. The support pillar layer F303 includes a plurality of support pillars in the display area, and the support pillars are located on the surface of the pixel definition layer F302 away from the base substrate F100, so as to support a fine metal mask (FMM) during the evaporation process. The organic light emitting functional layer F304 at least covers the pixel electrodes exposed by the pixel definition layer F302. Wherein, the organic light-emitting functional layer F304 may include an organic electroluminescent material layer, and may include one or more of a hole injection layer, a hole transport layer, an electron blocking layer, a hole blocking layer, an electron transport layer, and an electron injection layer. Each film layer of the organic light-emitting functional layer F304 can be prepared by an evaporation process, and a fine metal mask or an open mask can be used to define the pattern of each film layer during evaporation. The common electrode layer F305 may cover the organic light-emitting functional layer F304 in the display area. In this way, the pixel electrode, the common electrode layer F305 and the organic light-emitting functional layer F304 between the pixel electrode and the common electrode layer F305 form an organic electroluminescence diode F300D, and any organic electroluminescence diode can be used as a sub-pixel of the display panel.

In some embodiments, the pixel layer F300 may further include a light extraction layer located on the side of the common electrode layer F305 away from the base substrate F100, so as to enhance the light extraction efficiency of the organic light emitting diode.

Optionally, the pixel island may further include a thin film encapsulation layer F400. The thin film encapsulation layer F400 is disposed on the surface of the pixel layer F300 away from the base substrate F100, and may include alternately stacked inorganic encapsulation layers and organic encapsulation layers. Wherein, the inorganic encapsulation layer can effectively block moisture and oxygen from the outside, preventing water and oxygen from invading the organic light-emitting functional layer F304 and causing material degradation. Optionally, the edge of the inorganic encapsulation layer may be located in the encapsulation area. The organic encapsulation layer is located between two adjacent inorganic encapsulation layers, so as to realize planarization and weaken the stress between the inorganic encapsulation layers. Wherein, the edge of the organic encapsulation layer may be located between the edge of the display area and the edge of the inorganic encapsulation layer. Exemplarily, the thin film encapsulation layer F400 includes a first inorganic encapsulation layer F401, an organic encapsulation layer F402 and a second inorganic encapsulation layer F403 sequentially stacked on the side of the pixel layer F300 away from the base substrate F100.

Optionally, the display panel may further include a touch function layer F500, which is disposed on a side of the thin film encapsulation layer F400 away from the base substrate F100 for realizing touch operation of the display panel.

Optionally, the display panel may further include an anti-reflection layer F600, which may be disposed on the side of the thin-film encapsulation layer F400 away from the pixel layer F300 to reduce the reflection of the display panel on ambient light, thereby reducing the impact of ambient light on the display effect. In an embodiment of the present disclosure, the anti-reflection layer F600 may include a color filter layer and a black matrix layer that are stacked, so that the reduction of the light transmittance of the display panel can be avoided while reducing ambient light interference.

Figure 3:
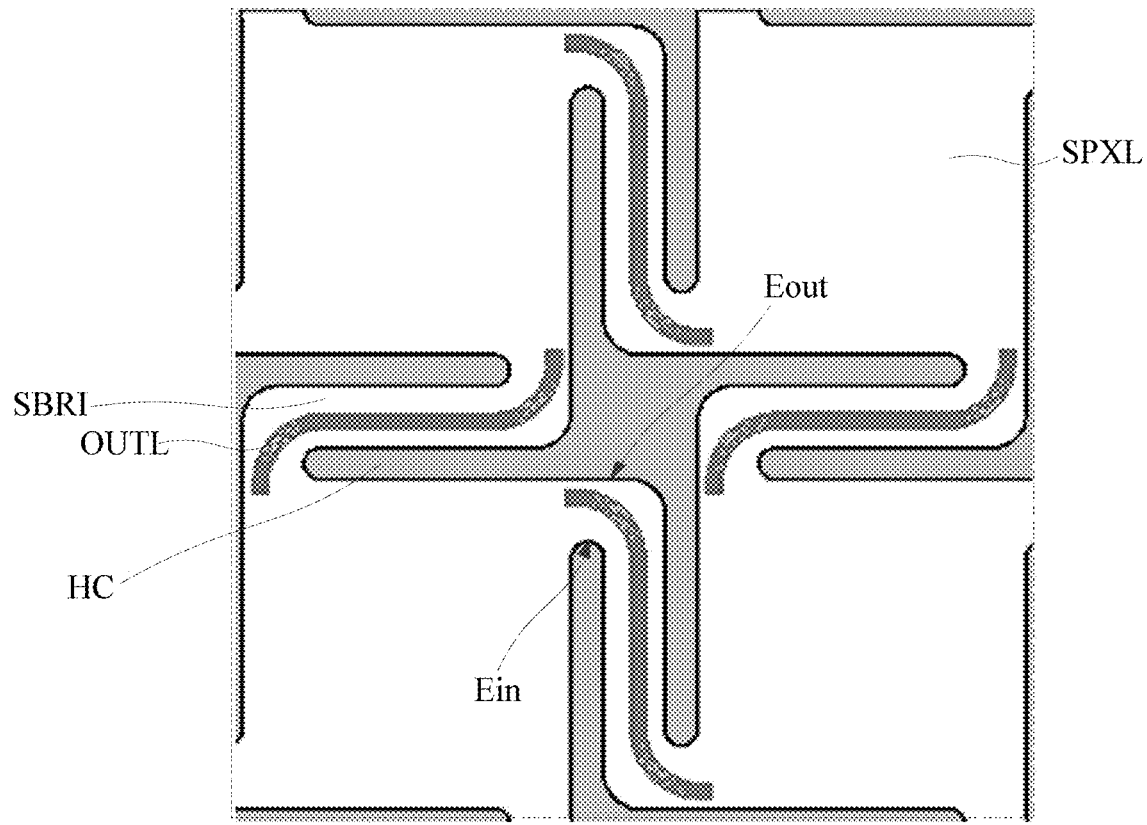
FIG. 3 is a schematic diagram of distribution of external signal wiring on a display panel in an embodiment of the present disclosure.

Referring to FIG. 3, in a non-stretched state, the bridging unit SBRI may have a bending region. During stretching, the bending degree of the bridging unit SBRI can be reduced so that the interval between the display islands SPXL is increased, and the bridging unit SBRI itself is prevented from being overly elongated. Furthermore, in the bending region, the bridging unit SBRI is in a smooth bending shape to avoid stress concentration due to sudden changes in the extension direction. In the present disclosure, the bridging unit SBRI may have one bending region, or may include multiple bending regions sequentially connected in series.

In one example, referring to FIG. 3, in the non-stretched state, the bridging unit SBRI includes a straight connection section and two curved connection sections located at both ends of the straight connection section; wherein, the curved connection section is connected to the display island SPXL, and the straight connection section is parallel to the edge of the adjacent display island SPXL. There may be a hollow area HC between the display island SPXL and the bridging unit SBRI, so as to increase the deformability of the display panel. Of course, it can be understood that the shape of the bridging unit SBRI of the present disclosure can also be other shapes, as long as it has a bending area.

Figure 4:
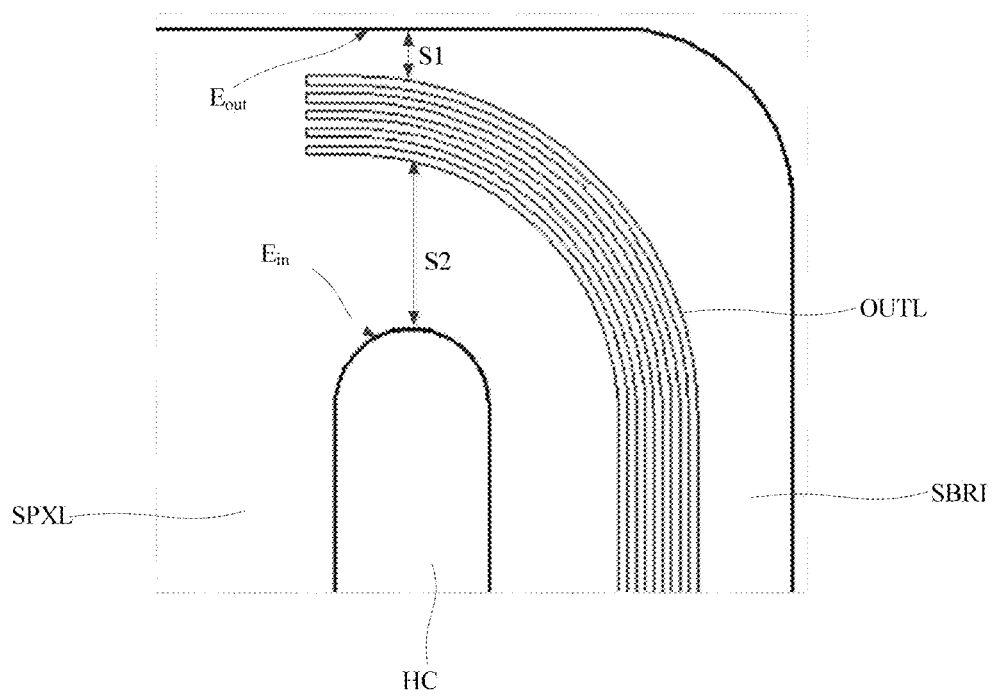
FIG. 4 is a partially enlarged schematic diagram of distribution of external signal wiring on a display panel in an embodiment of the present disclosure.

In the present disclosure, referring to FIG. 3, the bridging unit SBRI has two oppositely disposed edges in the bending region, i.e., a concave side edge Ein and a convex side edge Eout. When the bridging unit SBRI is stretched and deformed, the concave side edge Ein is more likely to be stretched and deformed with a larger amount of deformation, which leads to greater tensile stress near the concave side edge Ein. In the display panel of the present disclosure, referring to FIG. 3 and FIG. 4, the external signal wiring OUTL can be arranged close to the convex side edge Eout and away from the concave side edge Ein, so as to reduce the tensile stress acting on the external signal wiring OUTL, reducing the risk of damage to the external signal wiring OUTL. Exemplarily, in FIG. 4, in at least part of the bending region, the distance between the external signal wiring OUTL closest to the convex side edge Eout and the convex side edge Eout is S1, and the distance between the external signal wiring OUTL closest to the concave side edge Ein and the concave side edge Ein is S2, and S1 is smaller than S2.

In some embodiments of the present disclosure, referring to FIGS. 6 to 16, the bridging unit SBRI is provided with at least one stress relief hole HSTR. In this way, the tensile stress generated by the bridging unit SBRI during deformation is smaller, the stress generated at the concave side edge can be effectively released and the deformation capability of the bridging unit SBRI is improved.

In an embodiment of the present disclosure, the stress relief hole HSTR may be a hollow hole, so as to further improve the effect of the stress relief hole HSTR in reducing stress. Of course, in other embodiments of the present disclosure, the stress relief hole HSTR can also be a counterbore, that is, a non-through hole, which can also improve the deformability of the bridging unit SBRI to a certain extent and reduce the stress during deformation.

In one embodiment of the present disclosure, referring to FIG. 6 to FIG. 16, at least part of the stress relief hole HSTR is disposed in the bending region of the bridging unit SBRI.

In this way, the stress generated during the deformation of the bending region of the bridging unit SBRI can be effectively relieved, thereby eliminating or alleviating the restriction on the deformation capability of the display panel due to the deformation capability and stress intensity of the bending region of the bridging unit SBRI.

In one embodiment of the present disclosure, the bending area is divided into a plurality of wiring areas by the stress release hole HSTR, and an external signal wiring OUTL is laid in each of the wiring areas. Each of the wiring areas having an inner edge close to the concave side edge of the bending area and an outer edge close to the convex side edge of the bending area. In at least a part of the wiring area, the distance between the external signal wiring OUTL closest to the inner edge line and the inner edge is greater than the distance between the outer signal line OUTL closest to the outer edge and the outer edge. In this way, the external signal wiring OUTL can be arranged away from the concave side edge in at least a part of each wiring area, so as to reduce tensile stress on each external signal wiring OUTL.

As an example, referring to FIG. 6 to FIG. 16, the bridging unit SBRI includes a straight connection section and curved connection sections located at both ends of the straight connection section; wherein the curved connection section is the bending region of the bridging unit SBRI. A stress relief hole HSTR is provided on the curved connection section.

In one example, referring to FIG. 6 to FIG. 16, the stress relief holes HSTR are provided in each bending area.

Figure 8:
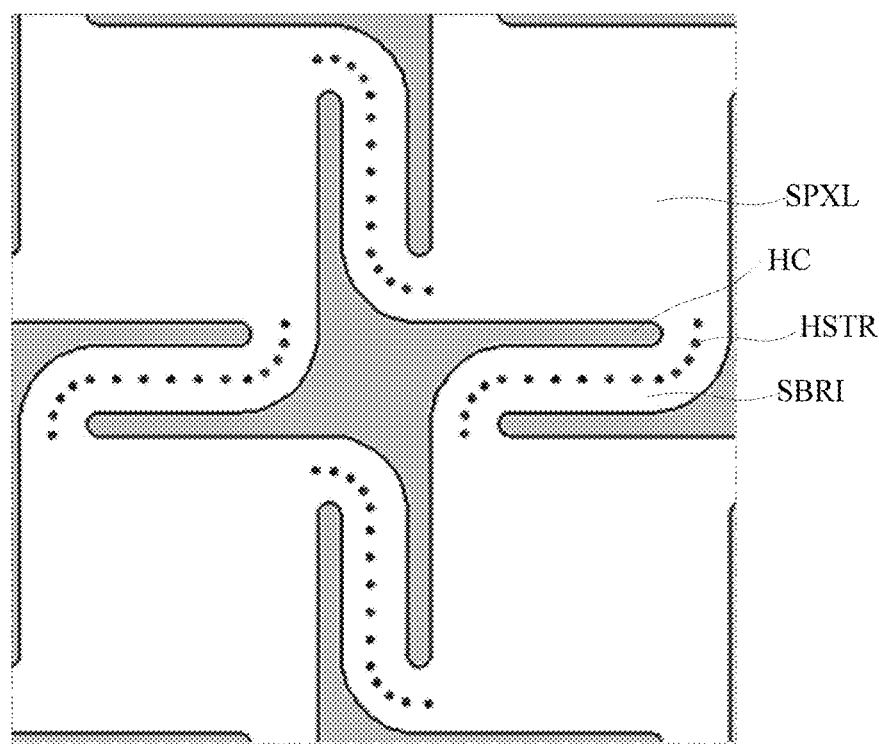
FIG. 8 is a structural schematic diagram of a stress relief hole provided on a bridging unit in an embodiment of the present disclosure.
Figure 10:
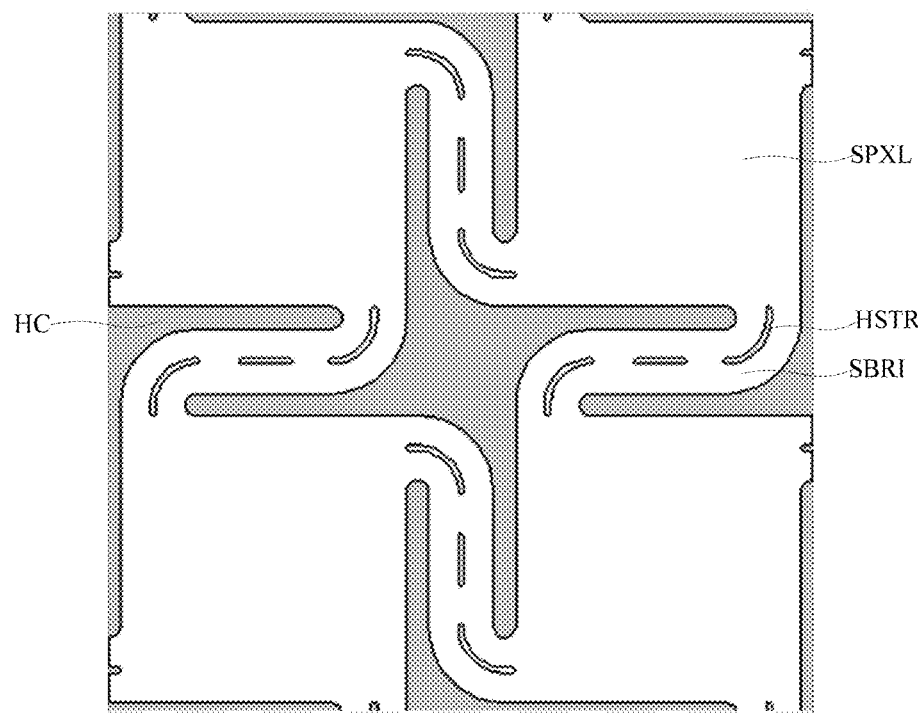
FIG. 10 is a schematic structural diagram of a stress relief hole provided on a bridging unit in an embodiment of the present disclosure.
Figure 11:
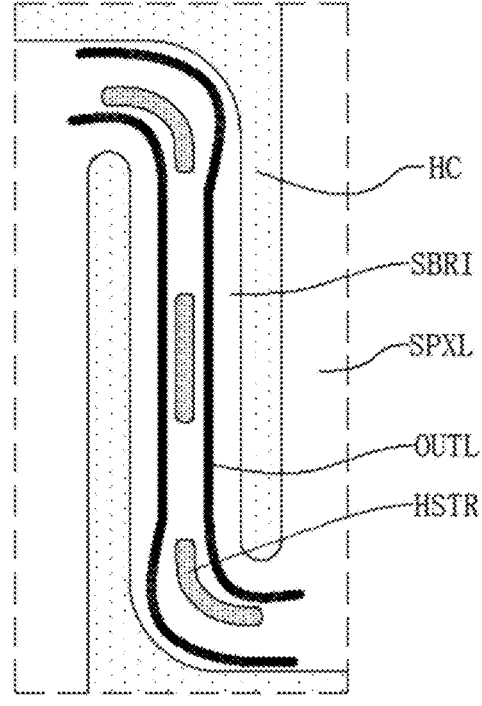
FIG. 11 is a schematic diagram of the distribution of stress relief holes and external signal wiring on the bridging unit in an embodiment of the present disclosure.
Figure 12:
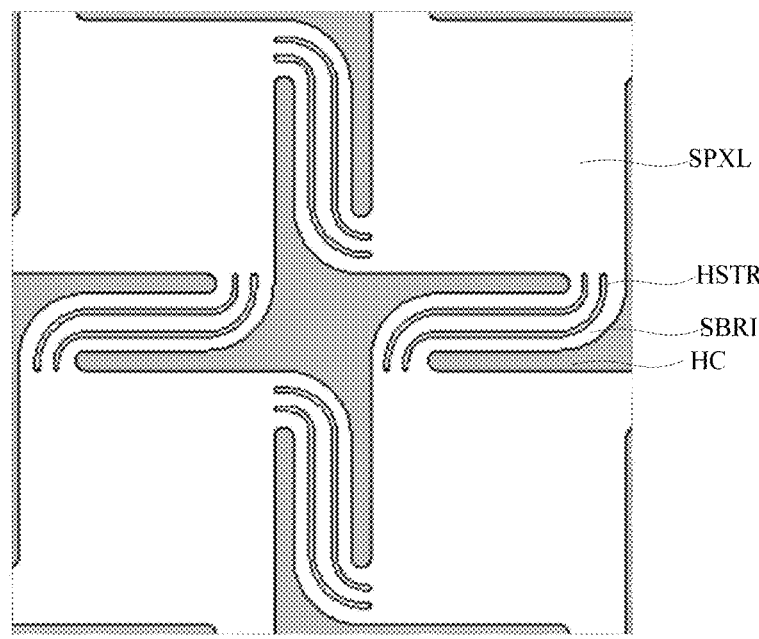
FIG. 12 is a structural schematic diagram of a stress relief hole provided on a bridging unit in an embodiment of the present disclosure.

In one example, referring to FIG. 8, FIG. 10 and FIG. 12, the bridging unit SBRI may also be provided with a stress relief hole HSTR in the area other than the bending area, so as to further reduce the stress of the bridging unit SBRI during bending and improve the bending ability of the bridging unit SBRI, and then improve the tensile performance of the display panel.

Figure 5:
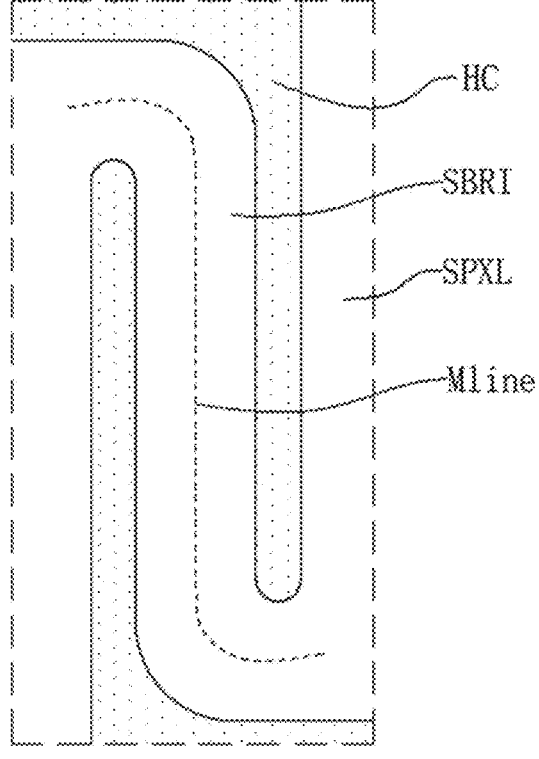
FIG. 5 is a schematic diagram of a middle line of a bridging unit in an embodiment of the present disclosure.
Figures 6, 7:
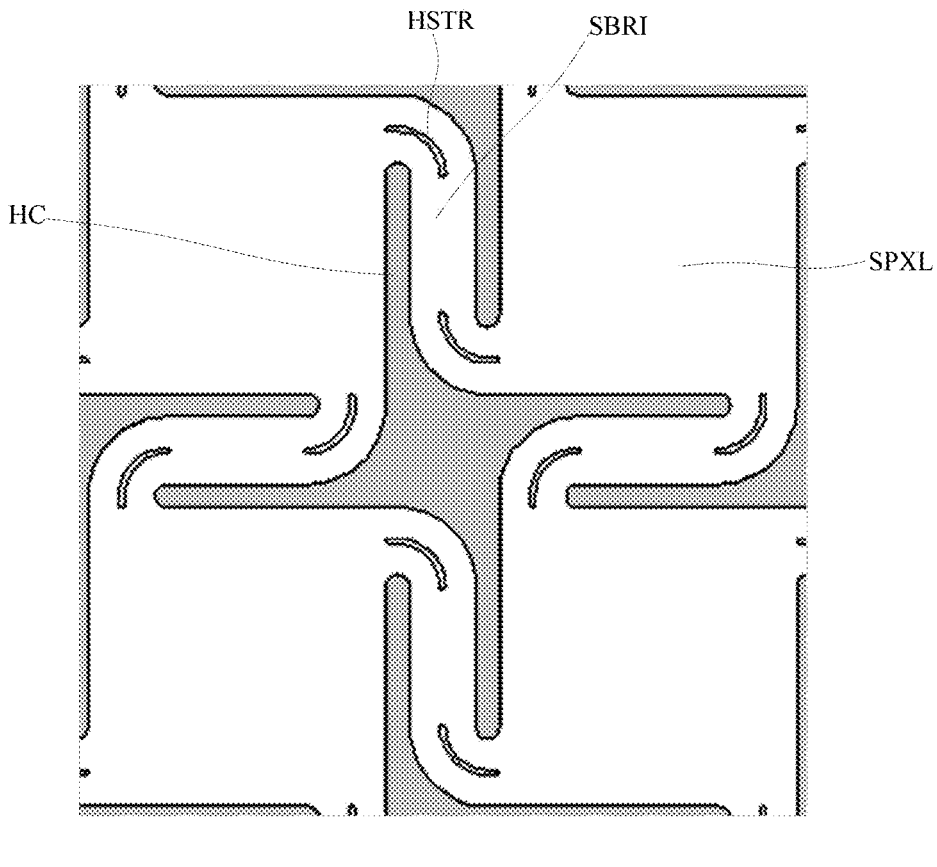
FIG. 6 is a structural schematic diagram of a stress relief hole provided on a bridging unit in an embodiment of the present disclosure.
FIG. 7 is a schematic diagram of distribution of stress relief holes and external signal wiring on the bridging unit in an embodiment of the present disclosure.

In an embodiment of the present disclosure, referring to FIG. 6 and FIG. 7, at least part of the stress relief hole HSTR may be a long hole, for example, a long circular hole. Further, the middle line of the elongated hole is substantially parallel to the middle line of the stress relief hole HSTR or the extension trend is basically the same. In this disclosure, the middle line of the long hole refers to a line formed by the points that are at the same distance from the two long sides of the long hole in the plane where the long hole is located. In other words, any point on the middle line of the long hole has the same distance from the two long sides of the long hole. The long side of the long hole refers to the edge that is consistent with the extending direction of the long hole. Referring to FIG. 5, the middle line Mline of the bridging unit SBRI refers to the line formed by the points at the same distance from the two edges of the bridging unit SBRI in the plane where the bridging unit SBRI is located. In other words, any point on the middle line of the bridging unit SBRI has the same distance from the two edges of the bridging unit SBRI.

In one embodiment of the present disclosure, referring to FIG. 12, among the long holes, at least one long hole runs through the bridging unit SBRI along the extending direction of the bridging unit SBRI. In this way, the long hole running through the bridging unit SBRI can reduce the stress of the bridging unit SBRI during deformation to a greater extent, and improve the deformation capability of the bridging unit SBRI to a greater extent.

Figure 9:
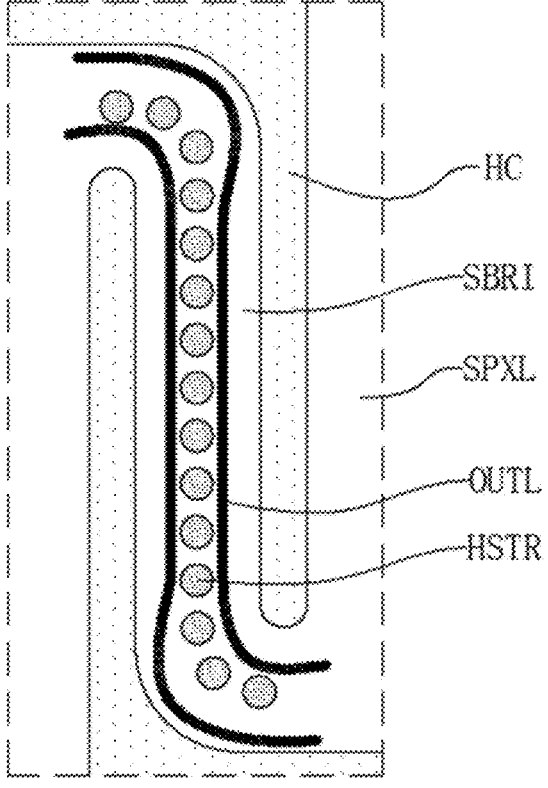
FIG. 9 is a schematic diagram of the distribution of stress relief holes and external signal wiring on the bridging unit in an embodiment of the present disclosure.

In one embodiment of the present disclosure, referring to FIG. 8 and FIG. 9, at least part of the stress relief hole HSTR is a round hole or an elliptical hole, which can also relieve the stress of the bridging unit SBRI during deformation and improve deformation capability of the bridging unit SBRI.

In one example, referring to FIG. 8, the bridging unit SBRI is provided with a plurality of round holes serving as stress relief holes HSTR; the arrangement tracks of the plurality of round holes are parallel to the middle line of the bridging unit SBRI.

In another example, the bridging unit SBRI is provided with a round hole and a long hole as the stress relief hole HSTR; the middle line of the long hole is parallel to the middle line of the bridging unit SBRI, and the arrangement trace of the long hole and the round hole is parallel to the middle line of the bridging unit SBRI.

In one embodiment of the present disclosure, at least one set of stress relief holes HSTR is provided on the bridging unit SBRI, and each set of stress relief holes HSTR includes a plurality of stress relief holes HSTR arranged in sequence; wherein, the arrangement track of each of the stress relief holes HSTR in each set of stress relief holes HSTR is parallel to the middle line of the bridging unit SBRI. Wherein, in the same set of stress relief holes HSTR, each stress relief hole HSTR may be the same or different, for example, all of them may be round holes or all of them may be long holes, or some of them may be round holes and some of them may be long holes.

In one example, as shown in FIGS. 6 to 11, a group of stress relief holes HSTR is provided on the bridging unit SBRI.

In another example, as shown in FIGS. 12 to 16, two sets of stress relief holes HSTR are provided on the bridging unit SBRI. Certainly, according to needs, more sets of stress relief holes HSTR may also be provided on the bridging unit SBRI.

Figure 13:
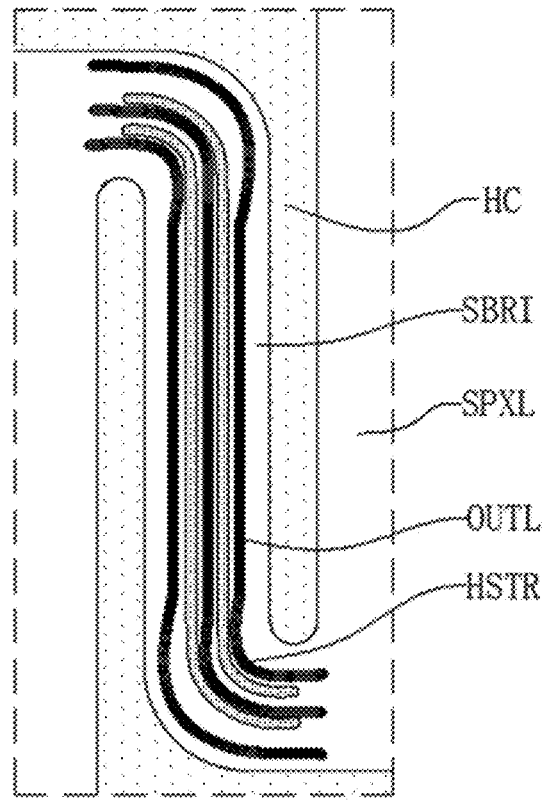
FIG. 13 is a schematic diagram of the distribution of stress relief holes and external signal wiring on the bridging unit in an embodiment of the present disclosure.
Figure 14:
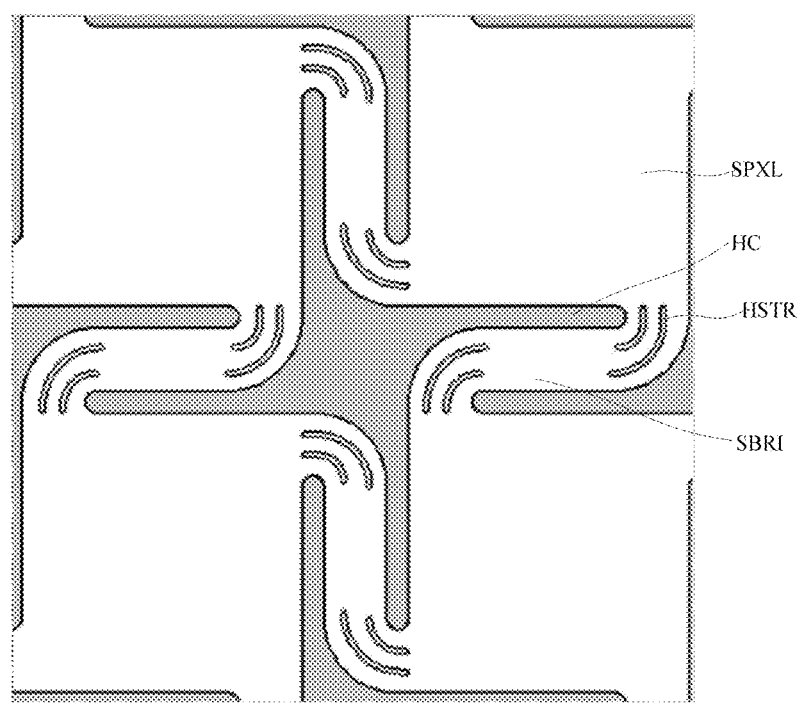
FIG. 14 is a structural schematic diagram of a stress relief hole provided on a bridging unit in an embodiment of the present disclosure.
Figure 15:
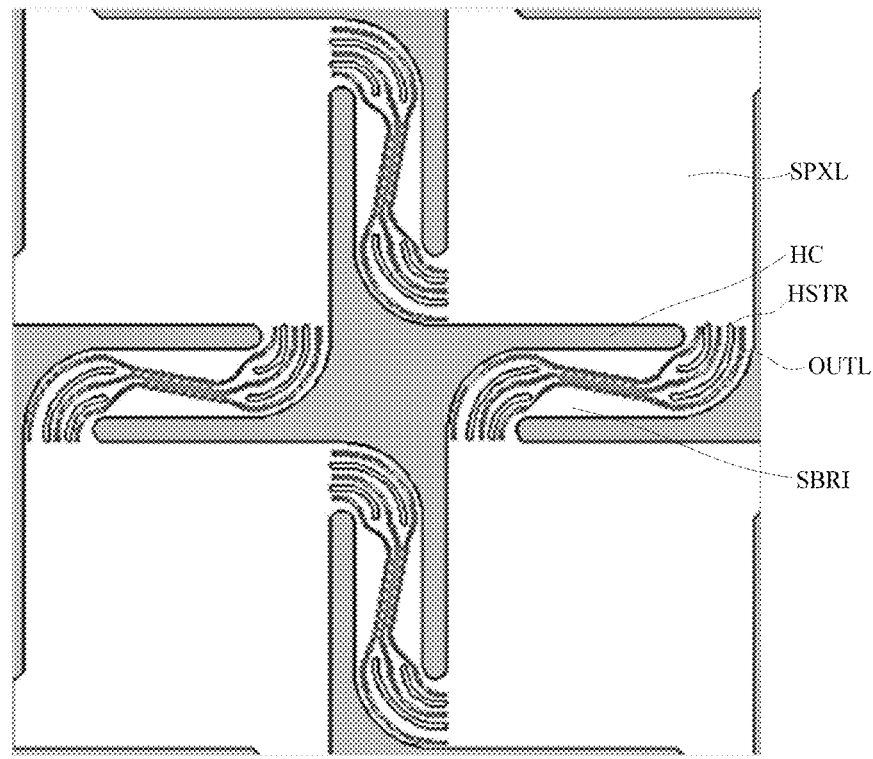
FIG. 15 is a schematic diagram of distribution of stress relief holes and external signal wiring on the bridging unit in an embodiment of the present disclosure.
Figure 16:
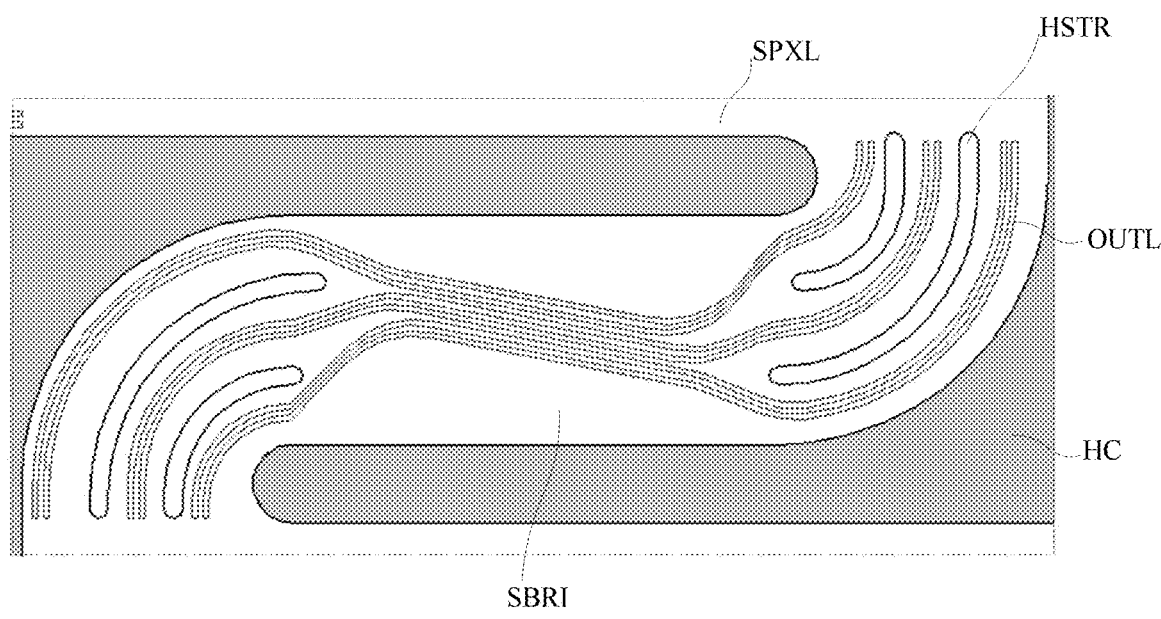
FIG. 16 is a partially enlarged schematic diagram of stress relief holes and external signal wiring on the bridging unit in an embodiment of the present disclosure.

In one example, referring to FIG. 12 and FIG. 13, each stress relief hole HSTR in at least one set of stress relief holes HSTR is sequentially merged into one long hole. In other words, at least one set of stress relief holes HSTR is a long hole. Further, the long hole runs through the bridging unit SBRI along the extending direction of the bridging unit SBRI.

In one embodiment of the present disclosure, the display panel includes a base substrate, a driving circuit layer and a pixel layer stacked in sequence; wherein, the display unit Upxl of the display island SPXL is formed in the driving circuit layer and the pixel layer on the base substrate. Specifically, the pixel driving circuit and the internal signal wiring INL can be formed in the driving circuit layer, and the light emitting element can be formed in the pixel layer. The bridging unit SBRI at least includes a base substrate and a driving circuit layer, and the external signal wiring OUTL may be formed in the driving circuit layer.

Figure 19:
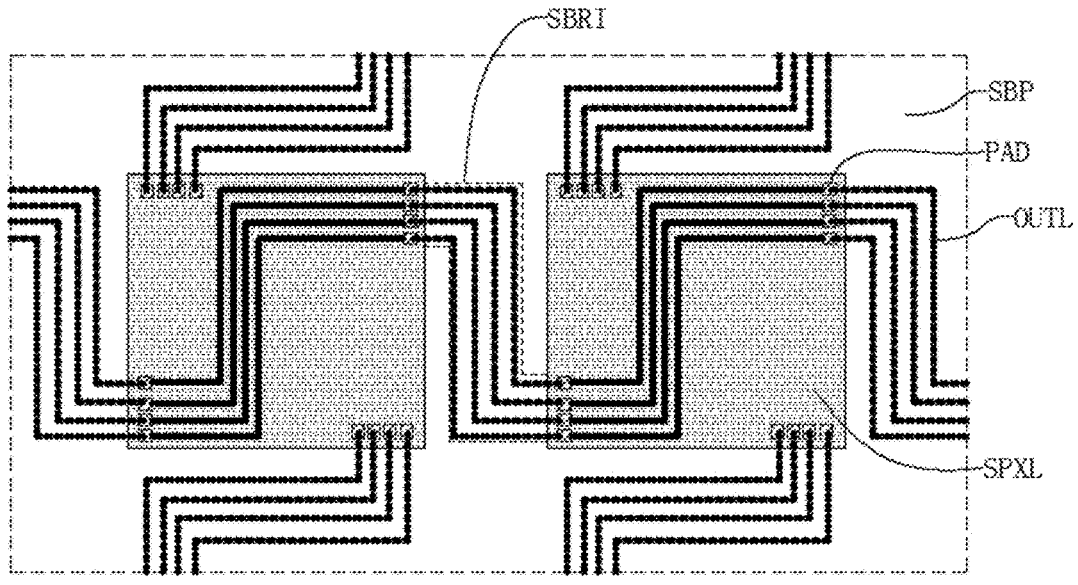
FIG. 19 is a schematic top view of preparing an external signal wiring between display islands in an embodiment of the present disclosure.
Figure 41:
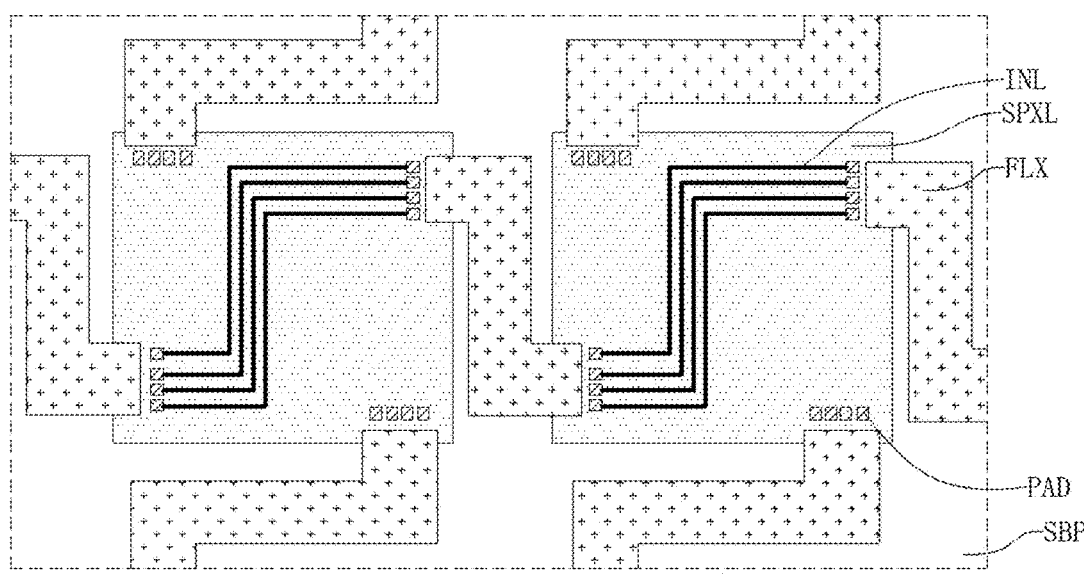
FIG. 41 is a schematic top view of preparing a flexible base material layer between display islands in an embodiment of the present disclosure.

In some other embodiments of the present disclosure, referring to FIG. 19 and FIG. 41, the display island SPXL is provided with a connection pad PAD electrically connected to the internal signal wiring INL, and the external signal wiring OUTL is lapped on the connection pad PAD so that the internal signal wiring INL is electrically connected to the external signal wiring OUTL. In other words, the display island SPXL has an internal signal wiring INL corresponding to the external signal wiring OUTL on the adjacent bridging unit SBRI, and has a connection pad PAD electrically connected to the internal signal wiring INL; the external signal wiring OUTL is lapped to the connection pad PAD, so that the external signal wiring OUTL is electrically connected to the corresponding internal signal wiring INL. Wherein, the external signal wiring OUTL may be an elastic conductor wiring. In this way, compared with the use of metal wiring as the external signal wiring OUTL, the elastic conductor wirings have greater elasticity and can withstand greater stress and deformation, and are less likely to be damaged due to deformation. In this way, the deformability of the display panel can be improved.

Further, the Young's modulus of elasticity of the elastic conductor wiring is smaller than the Young's modulus of elasticity of the display island SPXL, so as to ensure that the display island SPXL will not be deformed when the display panel is stretched and the display effect can be ensured.

In one embodiment of the present disclosure, both ends of the internal signal wiring INL are respectively connected to the connection pads PAD.

In one embodiment of the present disclosure, the connection pad PAD can be disposed in the source-drain metal layer, and can be directly connected to the internal signal column wiring VINL disposed in the source-drain metal layer, or electrically connected to the internal signal row wiring HINL located in the gate layer through a via hole.

In one embodiment of the present disclosure, the connection pad PAD may be disposed adjacent to the edge of the display island SPXL, so as to avoid blocking the display unit Upxl.

Figure 24:
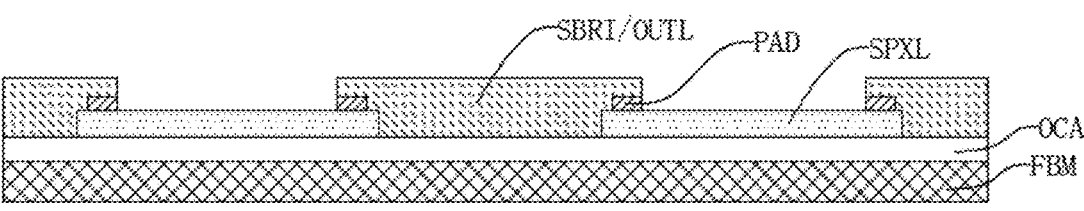
FIG. 24 is a schematic structural diagram of a display panel in an embodiment of the present disclosure.
Figure 48:
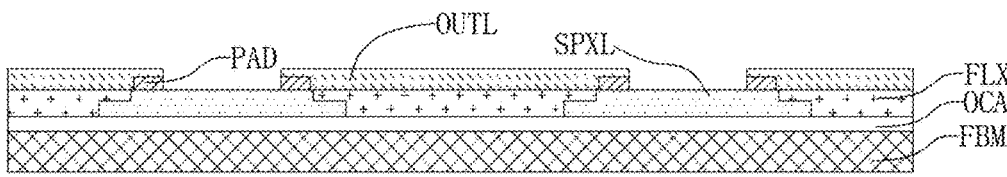
FIG. 48 is a schematic structural diagram of a display panel in an embodiment of the present disclosure.

In one embodiment of the present disclosure, referring to FIG. 24 and FIG. 48, the display panel further includes an elastic back film layer FBM, and the display island SPXL and the bridging unit SBRI are disposed on the same side of the elastic back film layer FBM. Wherein, the Young's modulus of elasticity of the elastic back film layer FBM is smaller than that of the display island SPXL and the bridging unit SBRI, especially smaller than that of the elastic conductor wiring. On the one hand, the elastic back film layer FBM can provide support, fixation and protection for the display island SPXL and the bridging unit SBRI, such as fixing the position of each external signal wiring OUTL, etc., and for another example, protecting the display island SPXL and the bridging unit SBRI to reduce the risk of damage to the display island SPXL and bridging unit SBRI. On the other hand, the elastic back film layer FBM has a smaller Young's modulus of elasticity without hindering the stretching deformation of the display panel.

In one example, the Young's modulus of elasticity of the elastic back film layer FBM is not greater than 1% of the Young's modulus of the display island SPXL, so as to further improve the stretchability of the display panel.

In one example, the display island SPXL includes a base substrate, a driving circuit layer, and a pixel layer that are sequentially stacked. The bridging unit SBRI is not provided with the base substrate, the driving circuit layer and the pixel layer. In this way, the bridging unit SBRI may not be provided with inorganic insulating layers, metal layers, polyimide layers and other film layers, thereby ensuring that the material of the bridging unit SBRI has better elasticity, lower Young's modulus of elasticity, and improving the deformation ability of the bridging unit SBRI and the ability to resist damage during deformation, thereby further improving the stretchability of the display panel.

In one example, the elastic back film layer FBM may be a film layer with hollow holes. The hollow hole between the display island SPXL and the bridging unit SBRI is overlapped with the hollow hole of the elastic back film layer FBM. For example, the hollow hole between the display island SPXL and the bridging unit SBRI is the first hollow hole, and the hollow hole of the elastic back film layer FBM is the second hollow hole; the orthographic projection of the first hollow hole on the plane where the elastic back film layer FBM is located completely covers the second hollow hole.

In another example, the elastic back film layer FBM may be an intact film layer without hollow holes, so that the display island SPXL and the bridging unit SBRI are easily attached to the elastic back film layer FBM.

As an example, referring to FIG. 24, the display panel includes an elastic back film layer FBM, and includes a display island SPXL and a bridging unit SBRI disposed on the same side of the elastic back film layer FBM. The display island SPXL includes a base substrate, a drive circuit layer, and a pixel layer that are sequentially stacked on one side of the elastic back film layer FBM. The bridging unit SBRI includes an elastic conductor wiring disposed at a side of the elastic back film layer FBM, and the ends of the elastic conductor wiring is lapped with a surface of the connection pad PAD of the display island SPXL (a surface of the connection pad PAD away from the base substrate). Further, an adhesive layer is provided between the elastic back film layer FBM and the display island SPXL and the bridging unit SBRI, for example, an optical adhesive layer OCA is provided, and the display island SPXL and the bridging unit SBRI are bonded to the elastic back film layer FBM.

Figure 61:
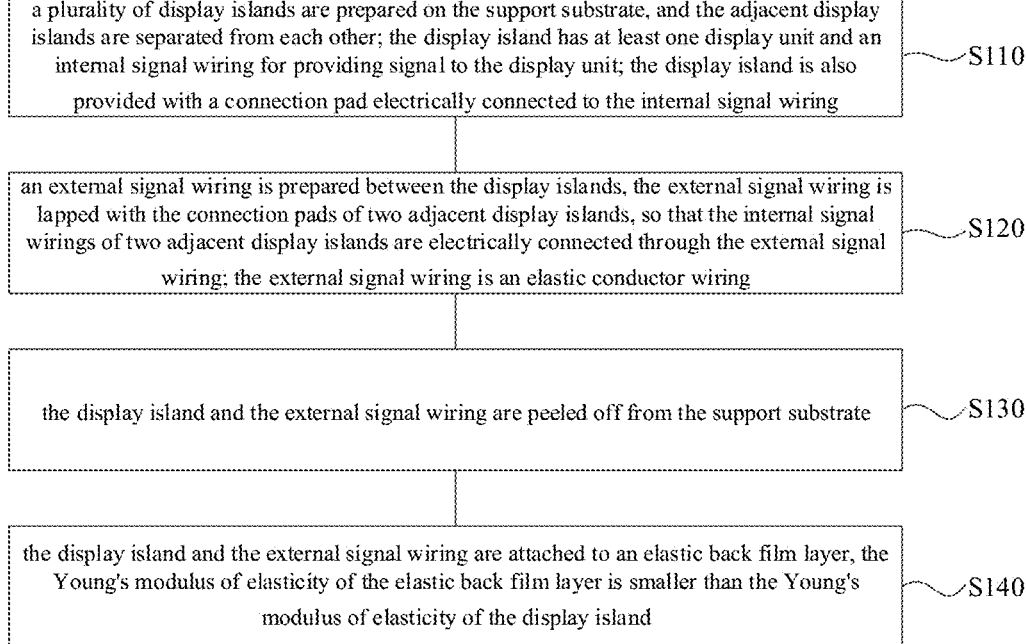
FIG. 61 is a schematic flowchart of a method for manu-facturing a display panel in an embodiment of the present disclosure.

In an embodiment of the present disclosure, referring to FIG. 61, the preparation method shown in step S110 to step S140 can be used to prepare the display panel of the embodiment of the present disclosure.

Figure 17:
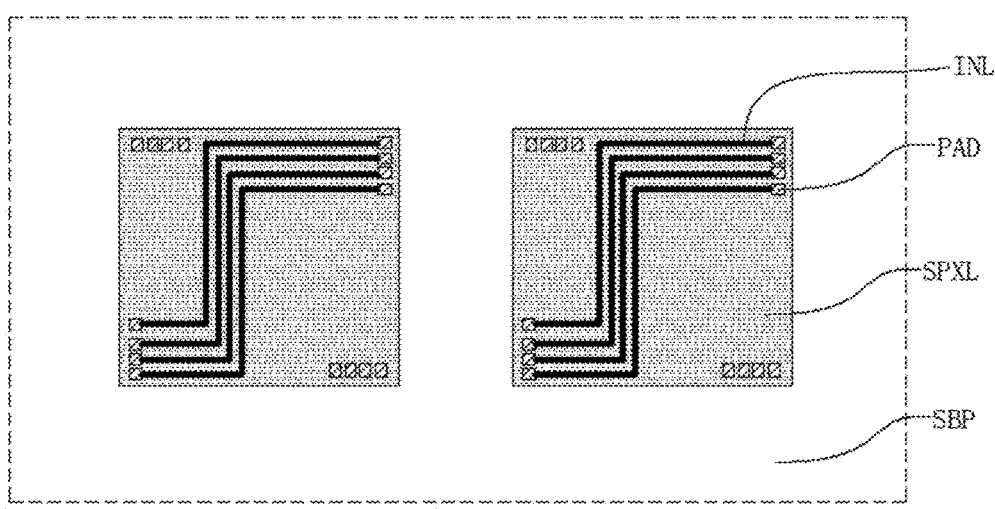
FIG. 17 is a schematic top view of preparing a display island on a support substrate in an embodiment of the present disclosure.
Figure 18:
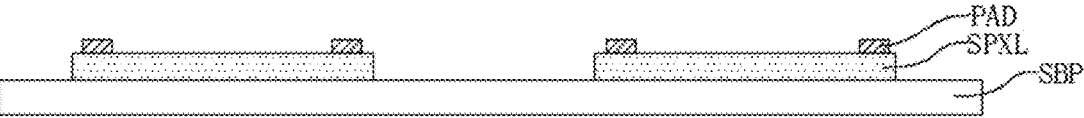
FIG. 18 is a schematic cross-sectional view of preparing a display island on a support substrate in an embodiment of the present disclosure.

Step S110, referring to FIG. 17 and FIG. 18, a plurality of display islands SPXL are prepared on the support substrate SBP, and the adjacent display islands SPXL are separated from each other; the display island SPXL has at least one display unit Upxl and an internal signal wiring INL for providing signal to the display unit Upxl; the display island SPXL is also provided with a connection pad PAD electrically connected to the internal signal wiring INL. In this way, each display island SPXL can be prepared on the support substrate SBP (such as a glass substrate) first, and each display island SPXL is hollowed out (the various film layers of the display island SPXL are hollowed out, and the support substrate SBP may not be hollowed out) so that the respective display islands SPXL are separated from each other, that is, the space between two adjacent display islands SPXL is a hollow area. Wherein, the side of the display island SPXL away from the support substrate SBP is provided with the connection pad PAD.

Figure 20:
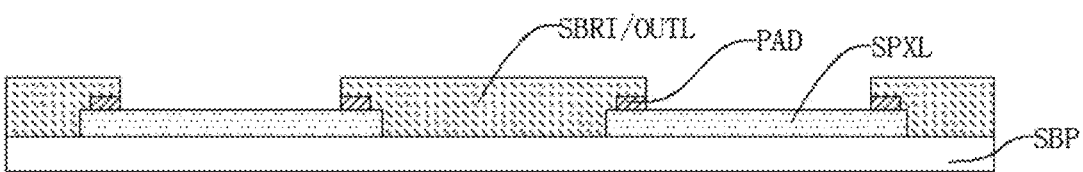
FIG. 20 is a schematic cross-sectional view of preparing an external signal wiring between display islands in an embodiment of the present disclosure.

Step S120, referring to FIG. 19 and FIG. 20, an external signal wiring OUTL is prepared between the display islands SPXL, the external signal wiring OUTL is lapped with the connection pads PAD of two adjacent display islands SPXL, so that the internal signal wirings INL of two adjacent display islands SPXL are electrically connected through the external signal wiring OUTL; the external signal wiring OUTL is an elastic conductor wiring.

Optionally, the elastic conductor wiring serving as the external signal wiring OUTL may be prepared in the hollow area by screen printing, printing, etching or other feasible methods. The two ends of the elastic conductor wirings are lapped on the connection pads PAD of two adjacent display islands SPXL, so that the internal signal wiring INL of the two adjacent display islands SPXL are electrically connected through the external signal wiring OUTL.

Figure 21:
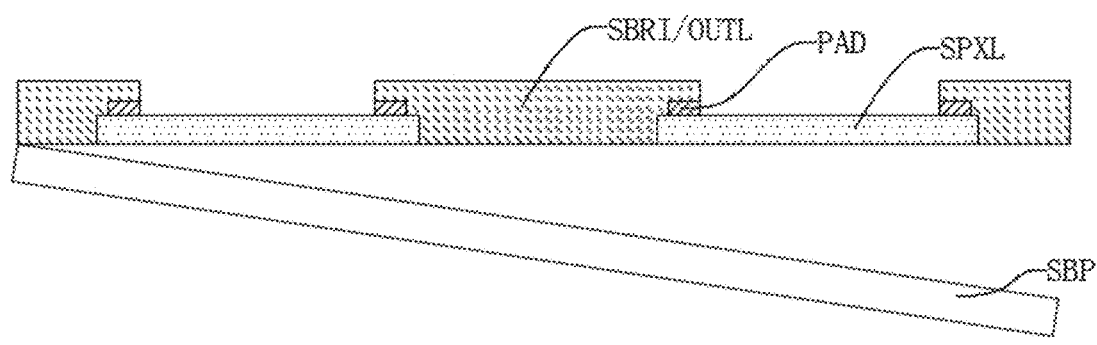
FIG. 21 is a schematic structural view of peeling off a supporting substrate in an embodiment of the present disclosure.
Figure 22:
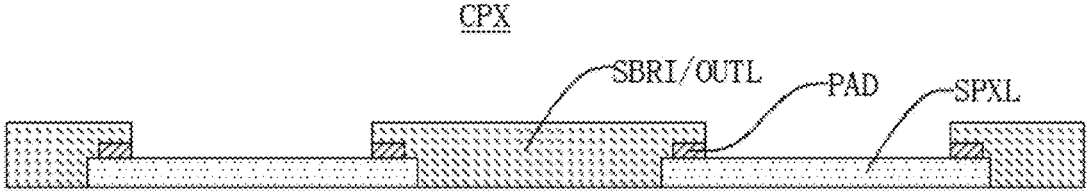
FIG. 22 is a schematic structural diagram of an assembly of a display island and an external signal wiring in an embodiment of the present disclosure.

Step S130, referring to FIG. 21 and FIG. 22, the display island SPXL and the external signal wiring OUTL are peeled off from the support substrate SBP to obtain an assembly CPX of the display island SPXL and the bridging unit SBRI.

Figure 23:
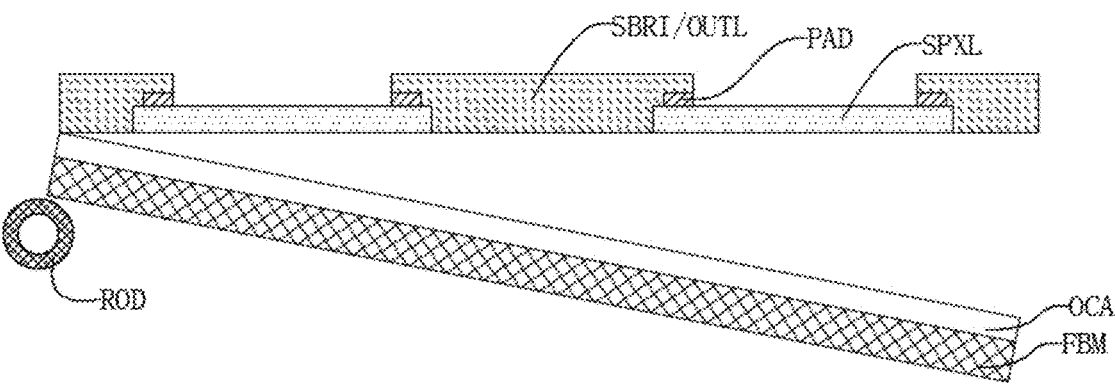
FIG. 23 is a structural schematic view of laminating the assembly of the display island and external signal wiring to the elastic back film layer in an embodiment of the present disclosure.

Step S140, referring to FIG. 23 and FIG. 24, the assembly CPX of the display island SPXL and the external signal wiring OUTL is attached to an elastic back film layer FBM, the Young's modulus of elasticity of the elastic back film layer FBM is smaller than the Young's modulus of elasticity of the display island SPXL. Exemplarily, the assembly CPX of the display island SPXL and the external signal wiring OUTL can be bonded to the elastic back film layer FBM pre-coated with an adhesive (such as optical glue), for example, the assembly can be attached to the elastic back film layer FBM using a roller ROD.

In one embodiment of the present disclosure, the material of the external signal wiring OUTL is a mixture of nano conductive material and elastic polymer, or one of PEDOT, liquid metal, and Mxene. Exemplarily, the nano-conductive material can be one or more of nano-conductive materials such as nano-silver wire, nano-copper wire, carbon nano-tube, graphene (and modified graphene), conductive carbon-based materials (such as graphite, etc.). In the present disclosure, PEDOT is a polymer of (3,4-ethylenedioxythio-phene monomer), which has electrical conductivity. Of course, other polymers having similar properties or structures to PEDOT can also be used as needed, for example, PEDOT-PSS, where PSS is polystyrene sulfonate. In this disclosure, MXene is a type of transition metal carbide/nitride with a two-dimensional layered structure, and its general chemical formula is $Mn+1XnTx$, wherein (n=1~3), M represents the early Transition metals, such as Ti, Zr, V, Mo, etc.; X represents C or N elements, and Tx is a surface group, usually one or more of —OH, —O, —F and —Cl.

Optionally, the elastic polymer can be a mixture of one or more of PDMS (polydimethylsiloxane), PET (polyethylene terephthalate), PEN (polyethylene naphthalate), epoxy resin such as PU (polyurethane), silicone (such as silicone rubber or silicone resin), rubber, and the like.

It can be understood that, in the present disclosure, other elastic conductive materials can also be used to prepare the external signal wiring OUTL, so that the external signal wiring OUTL have elasticity under the condition of being conductive.

Figure 25:
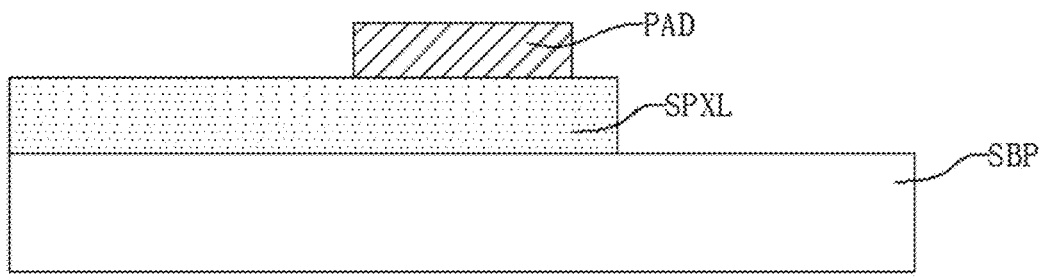
FIG. 25 is a schematic diagram of the structure of connection pads on a display island in an embodiment of the present disclosure.
Figure 26:
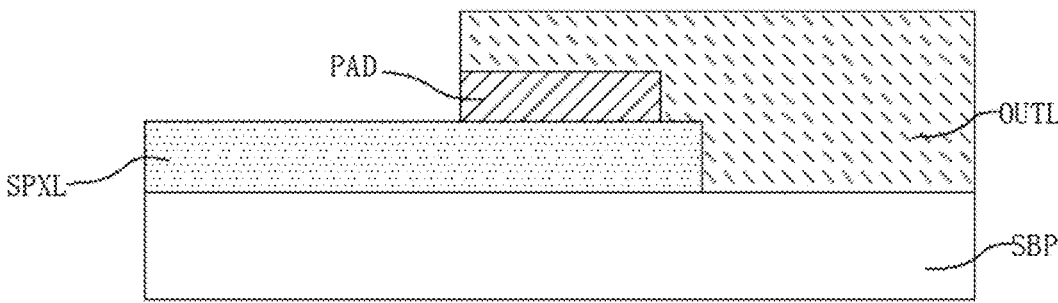
FIG. 26 is a structural schematic diagram of a lapping between a connection pad and an elastic conductor wiring in an embodiment of the present disclosure.

In one embodiment of the present disclosure, referring to FIG. 27 to FIG. 34, a first reinforcing hole H1 or a protruding piece BU1 matching the connection pad PAD may be provided to improve the adhesion between the connection pad PAD and the external signal wiring OUTL, to overcome the risk that the connection pad PAD and the external signal wiring OUTL are easily separated from each other due to the small adhesion between materials. In this way, the disconnection of the external signal wiring OUTL and the internal signal wiring INL caused by the disconnection of the external signal wiring OUTL and the connection pad PAD during the stretching process of the display panel can be avoided. Of course, in other embodiments of the present disclosure, as shown in FIG. 25 and FIG. 26, it is also possible not to dispose the first reinforcing hole H1 or the protruding piece BU1 to match the connection pad PAD, but to use other means to improve the adhesion between the connection pad PAD and the external signal wiring OUTL or reduce the stress between the connection pad PAD and the external signal wiring OUTL when stretched.

Figure 27:
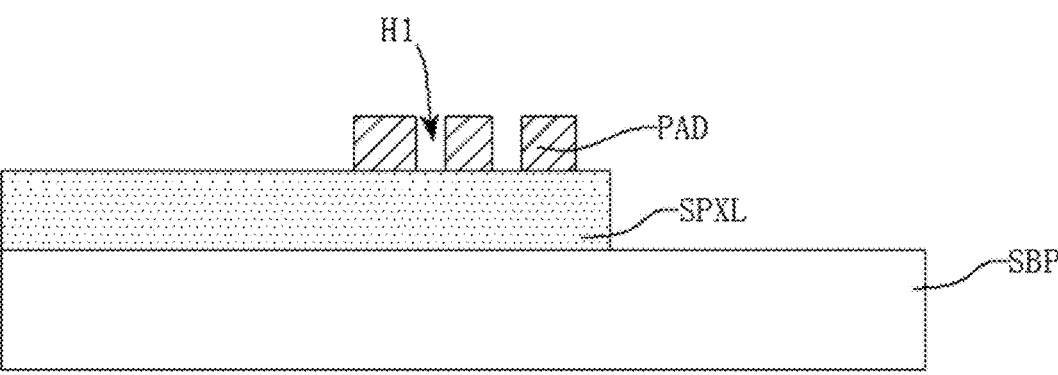
FIG. 27 is a schematic diagram of the structure of connection pads on a display island in an embodiment of the present disclosure.
Figure 28:
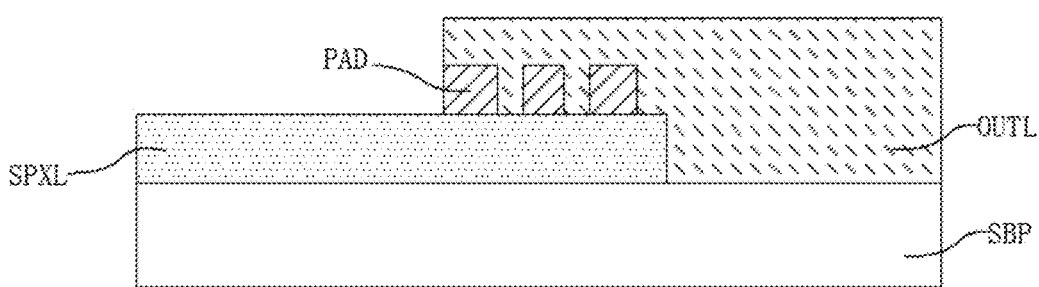
FIG. 28 is a structural schematic diagram of a lapping between a connection pad and an elastic conductor wiring in an embodiment of the present disclosure.

In one example, referring to FIG. 27 and FIG. 28, the connection pad PAD is provided with at least one first reinforcing hole H1, and the external signal wiring OUTL at least partially covers the first reinforcing hole H1. In this way, the external signal wiring OUTL can be partially snapped into the first reinforcing hole H1, which increases the adhesion between the external signal wiring OUTL and the connection pad PAD, and reduces the risk of the external signal wiring OUTL peeling off from the connection pad PAD. Referring to FIG. 27, along the normal direction of the display panel, the first reinforcing hole H1 penetrates through the connection pad PAD. Of course, in other embodiments of the present disclosure, the first reinforcing hole H1 may not penetrate through the connection pad PAD, for example, it is only a groove provided on the connection pad PAD.

Figure 29:
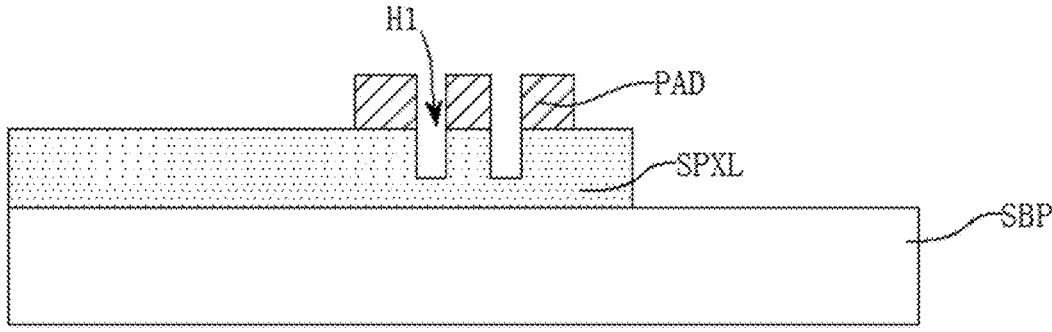
FIG. 29 is a schematic diagram of the structure of connection pads on a display island in an embodiment of the present disclosure.
Figure 30:
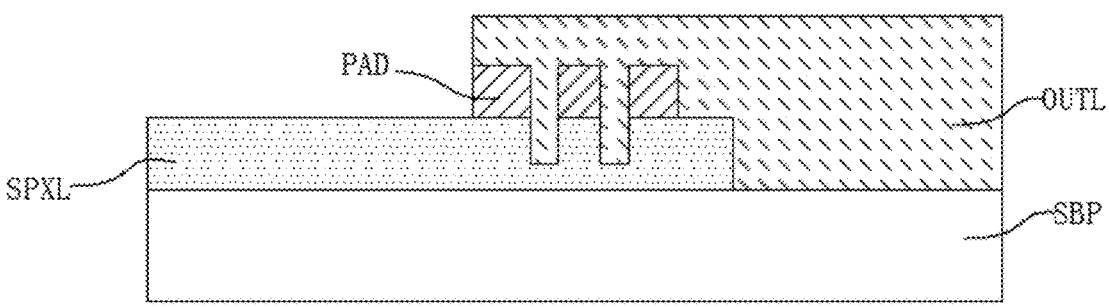
FIG. 30 is a structural schematic diagram of a lapping between a connection pad and an elastic conductor wiring in an embodiment of the present disclosure.

In one example, referring to FIG. 29 and FIG. 30, along the normal direction of the display panel, the first reinforcing hole H1 penetrates the connection pad PAD and extends away from the external signal wiring OUTL. In this way, the first reinforcing hole H1 may penetrate the connection pad PAD and extend into the film layer below the connection pad PAD (closer to the substrate substrate), for example, the first reinforcing hole H1 penetrates the connection pad PAD and extends into the interlayer dielectric layer. In this way, the depth of the first reinforcing hole H1 can be further increased, thereby further improving the adhesion between the connection pad PAD and the external signal wiring OUTL.

Figure 31:
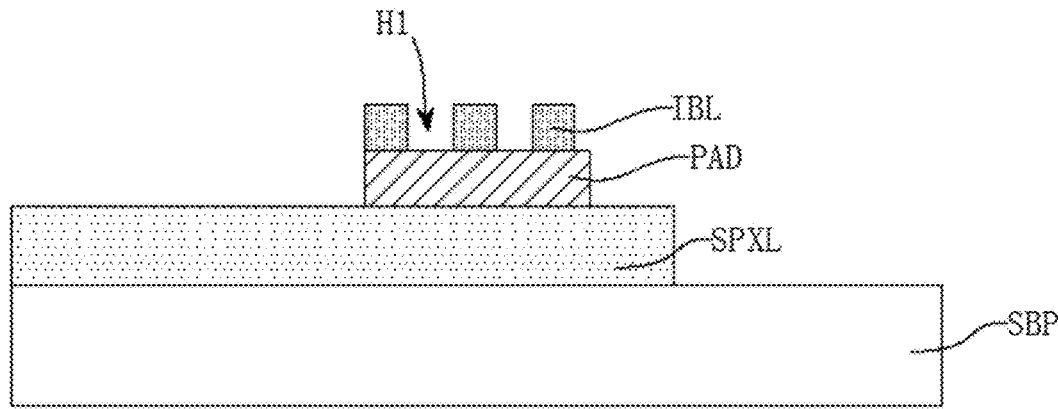
FIG. 31 is a schematic diagram of the structure of connection pads on a display island in an embodiment of the present disclosure.
Figure 32:
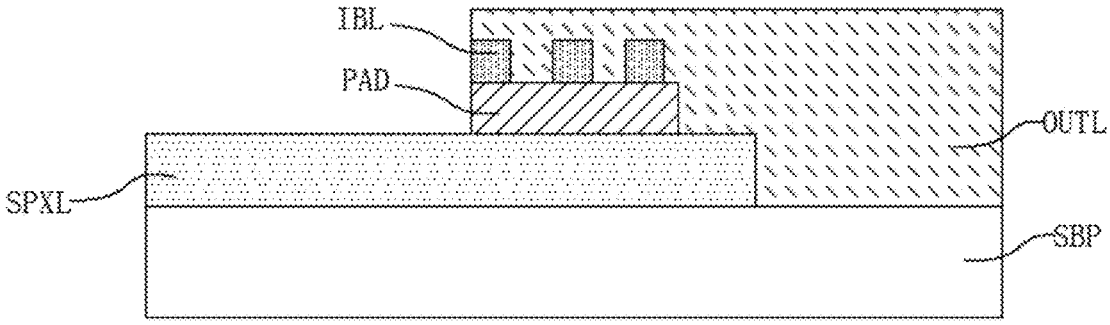
FIG. 32 is a structural schematic diagram of the lapping between the connection pad and the elastic conductor wiring in an embodiment of the present disclosure.

In one example, referring to FIG. 31 and FIG. 32, an inorganic medium layer IBL is disposed between the connection pad PAD and the external signal wiring OUTL, the inorganic medium layer IBL is disposed with at least a first reinforcing hole H1 to expose the connection pad PAD in a partial area; and the external signal wiring OUTL is electrically connected to the connection pad PAD through the first reinforcing hole H1. The adhesion between the inorganic medium layer IBL and the connection pad PAD is greater than the adhesion between the external signal wiring OUTL and the connection pad PAD. In this way, on the one hand, the external signal wiring OUTL is electrically connected to the connection pad PAD through the first reinforcing hole H1, and on the other hand, the adhesion between the external signal wiring OUTL and the connection pad PAD is ensured by the first reinforcing hole H1.

In a further example, the adhesion between the connection pad PAD and the external signal wiring OUTL is smaller than the adhesion between the external signal wiring OUTL and the inorganic medium layer IBL. In this way, the inorganic medium layer IBL can be used as an intermediate layer to have greater adhesion to the connection pad PAD and the external signal wiring OUTL, so that problems such as film layer peeling between the connection pad PAD and the external signal wiring OUTL are not easy to occur, thereby overcoming the problem of poor direct adhesion between the connection pad PAD and the external signal wiring OUTL.

As an example, the electrodeless adhesion layer may be an inorganic dielectric layer, such as a silicon oxide layer, a silicon nitride layer, a silicon oxynitride layer, and the like.

Figure 33:
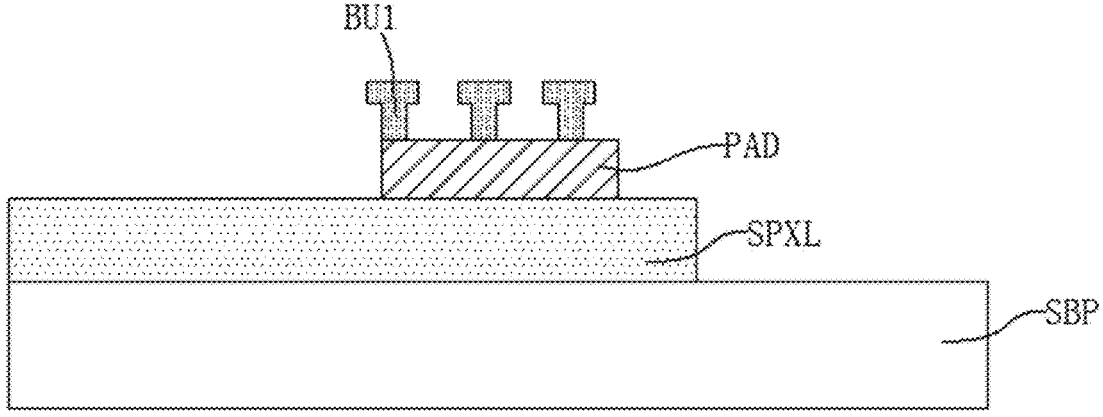
FIG. 33 is a schematic diagram of the structure of connection pads on a display island in an embodiment of the present disclosure.
Figure 34:
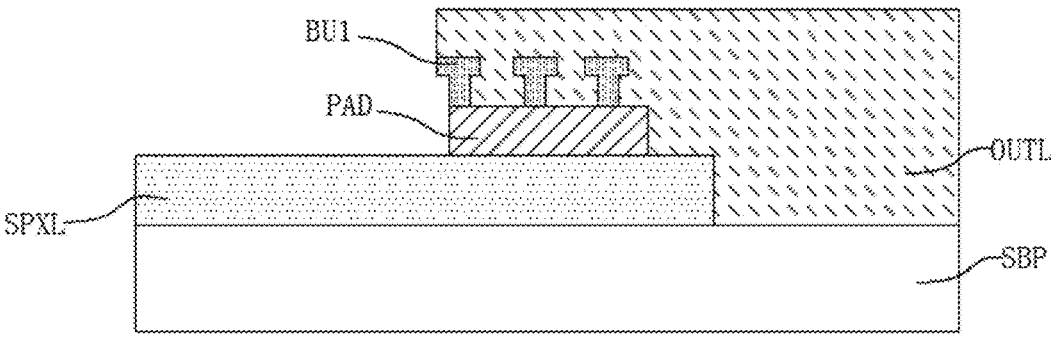
FIG. 34 is a structural schematic diagram of a lapping between a connection pad and an elastic conductor wiring in an embodiment of the present disclosure.

In one example, referring to FIG. 33 and FIG. 34, a protruding piece BU1 is provided on the surface of the connection pad PAD close to the external signal wiring OUTL, and the external signal wiring OUTL covers the protruding piece BU1 and is electrically connected with the external signal wiring OUTL. The adhesion between the protruding piece BU1 and the connection pad PAD is greater than the adhesion between the external signal wiring OUTL and the connection pad PAD. In this way, the protruding piece BU1 can be snapped into the external signal wiring OUTL, thereby improving the adhesion between the external signal wiring OUTL and the connection pad PAD.

In one example, referring to FIG. 35 to FIG. 38, there may be multiple first reinforcing holes H1 or protruding pieces BU1 matching the connection pad PAD, so as to further improve the attaching force between the external signal wiring OUTL and the connection pad PAD. The plurality of first reinforcing holes H1 or the plurality of protruding pieces BU1 are arranged in a regular or irregular manner.

In an example, the first reinforcing hole H1 or the protruding piece BU1 may be in a rectangular, square, circular, elliptical, triangular, hexagonal, zigzag or other feasible shapes.

Figure 35:
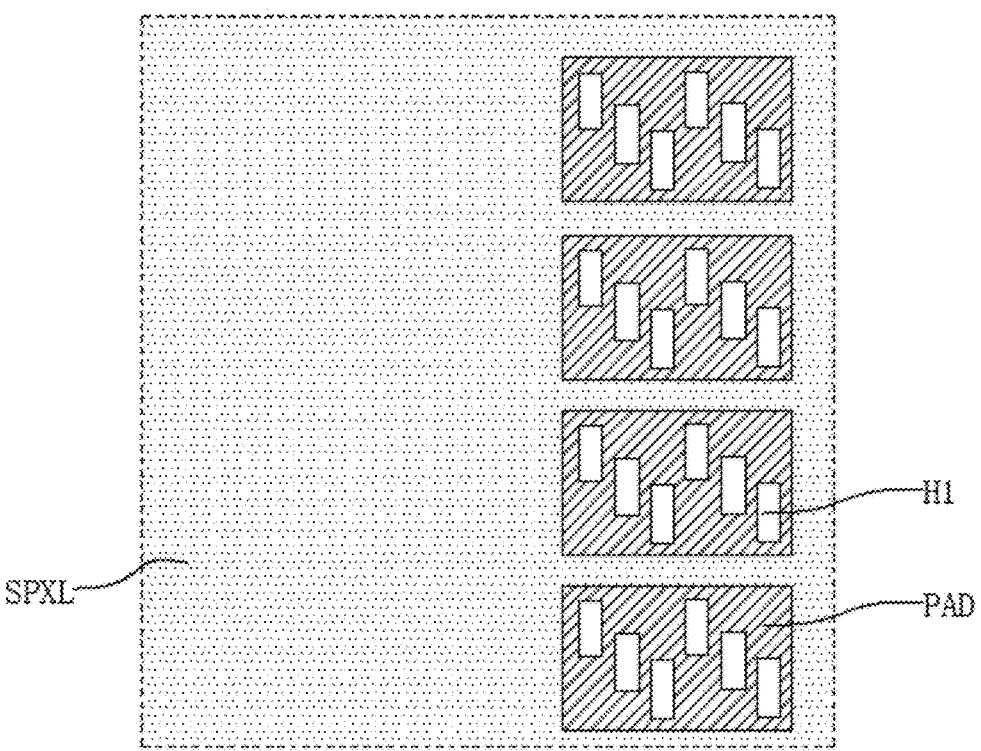
FIG. 35 is a schematic top view of the first reinforcing hole in an embodiment of the present disclosure.

As an example, referring to FIG. 35, the first reinforcing holes H1 are rectangular in shape and are multiple in number, and the extending direction of each first reinforcing hole H1 is perpendicular to the extending direction of the external signal wiring OUTL. The multiple first reinforcing holes H1 are in a periodic arrangement.

Figure 36:
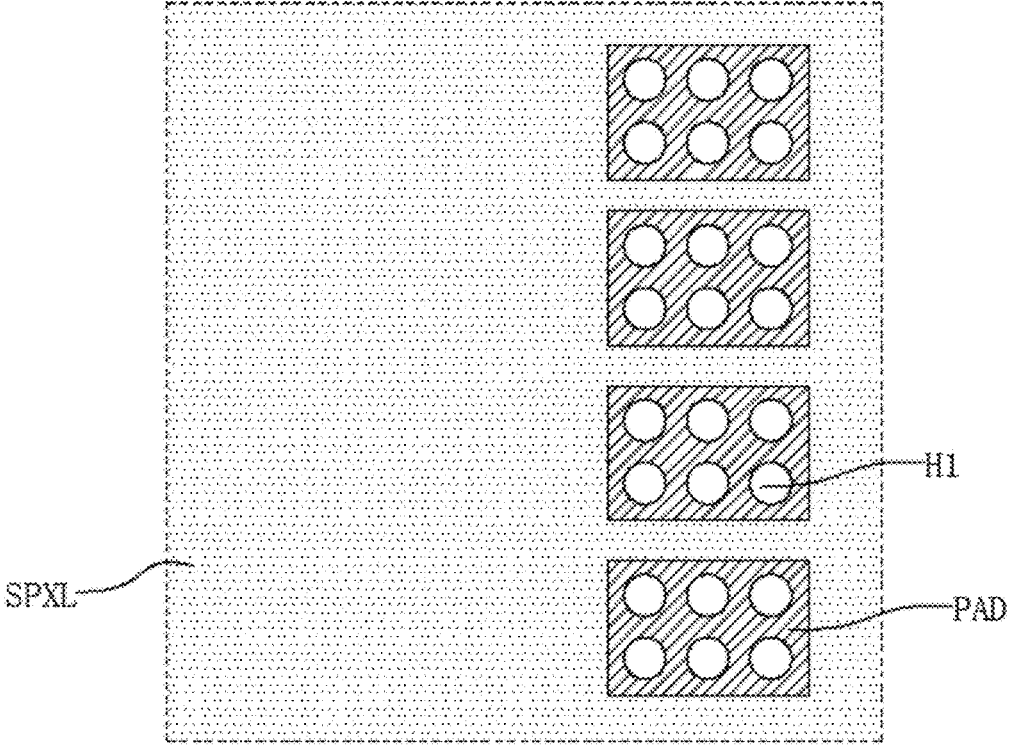
FIG. 36 is a schematic top view of the first reinforcing hole in an embodiment of the present disclosure.

As an example, referring to FIG. 36, the first reinforcing holes H1 are circular in shape and are multiple in number, and the plurality of first reinforcing holes H1 are distributed in matrix.

Figure 37:
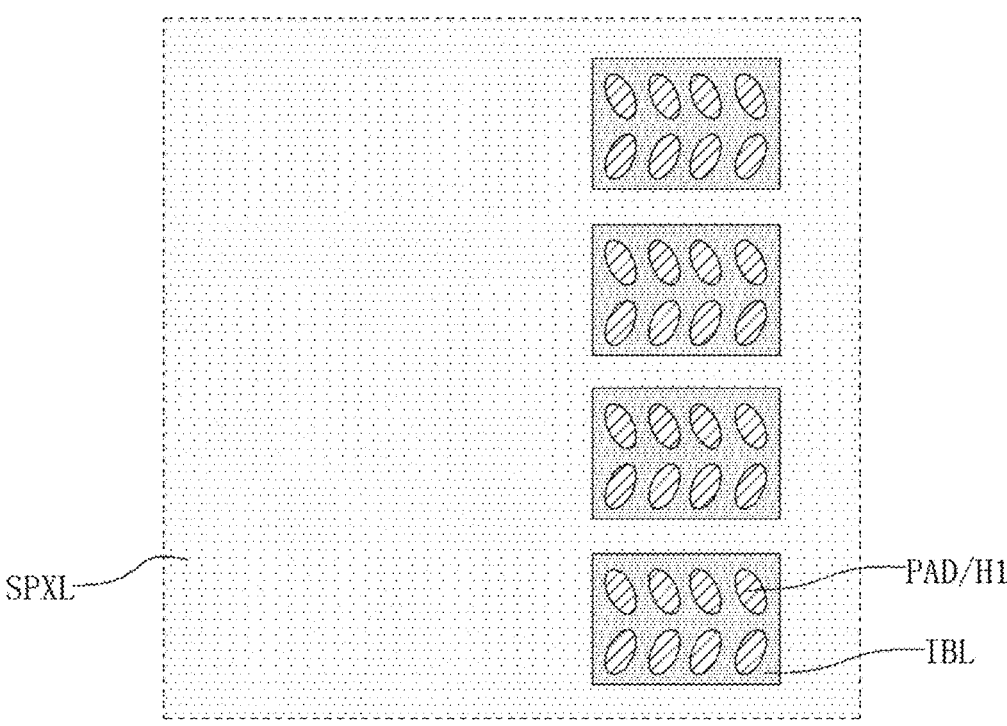
FIG. 37 is a schematic top view of a first reinforcing hole in an embodiment of the present disclosure.

As an example, referring to FIG. 37, the first reinforcing holes H1 are oval in shape and are multiple in number. Corresponding to one connection pad PAD, each first reinforcing hole H1 is arranged in two rows, and the two rows of first reinforcing holes H1 are disposed symmetrically to each other.

Figure 38:
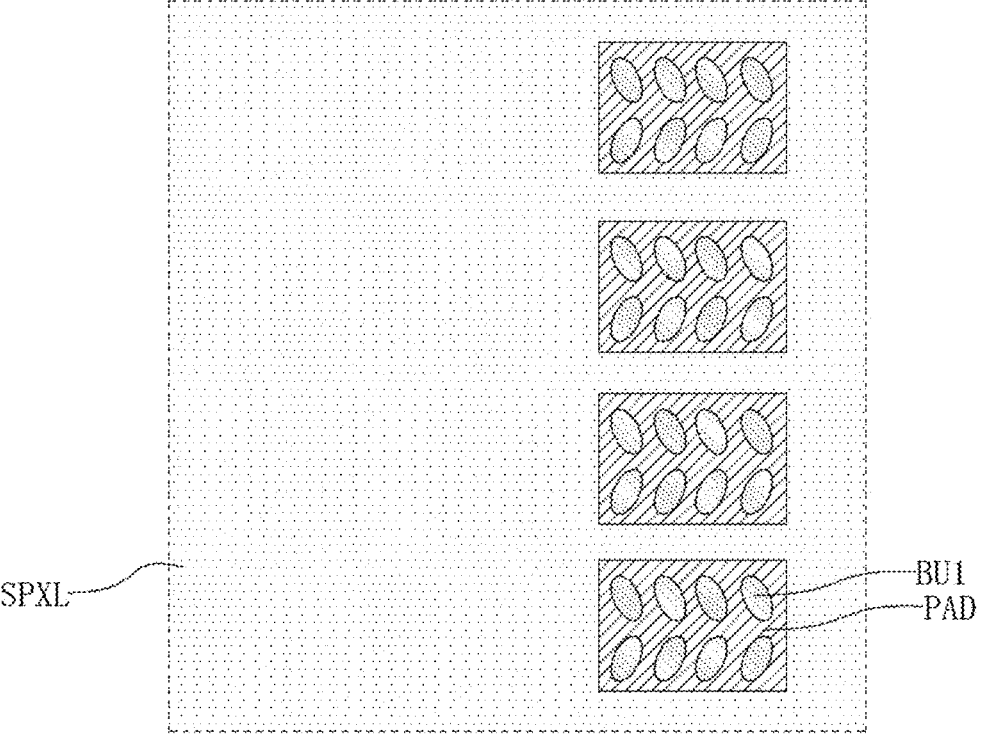
FIG. 38 is a schematic top view of a protruding piece in an embodiment of the present disclosure.

As an example, referring to FIG. 38, the protruding pieces BU1 are elliptical in shape and are multiple in number. Corresponding to one connection pad PAD, each protruding piece BU1 is arranged in two rows, and the two rows of protruding pieces BU1 are arranged symmetrically to each other.

In one example, referring to FIG. 33, the protruding piece BU1 can be T-shaped, that is, the size of the top of the protruding piece BU1 (the side away from the base substrate) can be larger, and at least part of a part below the top of the protruding piece BU1 (the side close to the base substrate) is smaller than the size of the top end of the protruding piece BU1. In other words, for the gap formed between adjacent protruding pieces BU1, the opening of the gap (the opening on the side away from the base substrate) is smaller, and the size of at least part of the gap is larger than the size of the opening of the gap. Certainly, in other embodiments of the present disclosure, the protruding piece BU1 may also be in an H-shape.

In one embodiment of the present disclosure, referring to FIG. 48, the bridging unit SBRI further includes a flexible base material layer FLX, the flexible base material layer FLX is lapped with display island SPXL, and the flexible base material layer FLX overlaps with the external signal wiring OUTL. On the one hand, the flexible base material layer FLX is lapped with the display island SPXL, which can improve the bonding strength between the display island SPXL and the bridging unit SBRI, and reduce the stress between the elastic conductor wiring OUTL served as the external signal wiring and the connection pad PAD, thereby reducing the risk of the external signal wiring OUTL peeling off from the connection pad PAD. On the other hand, the flexible base material layer FLX can also fix and constrain the external signal wiring OUTL, reducing the risk of the external signal wiring OUTL contacting each other and causing a short circuit when deformed.

In one example, referring to FIG. 48, the external signal wiring OUTL are provided on the surface of the flexible base material layer FLX away from the elastic back film layer FBM. In this way, the flexible base material layer FLX can provide support and fixation for the external signal wiring OUTL, reduce the level difference when the external signal wiring OUTL is routed, and reduce the risk of open circuit and short circuit of the external signal wiring OUTL.

In one example, the Young's modulus of the flexible base material layer FLX is smaller than that of the display island SPXL and larger than that of the elastic back film layer FBM.

As an example, the material of the flexible base material layer FLX can be PDMS (polydimethylsiloxane), PET (polyethylene terephthalate), PEN (polyethylene naphthalate), PU (polyurethane) and other epoxy resins, silicon-based (such as silicone rubber or silicone resin), rubber and other elastic polymers or a mixture of more.

Figure 39:
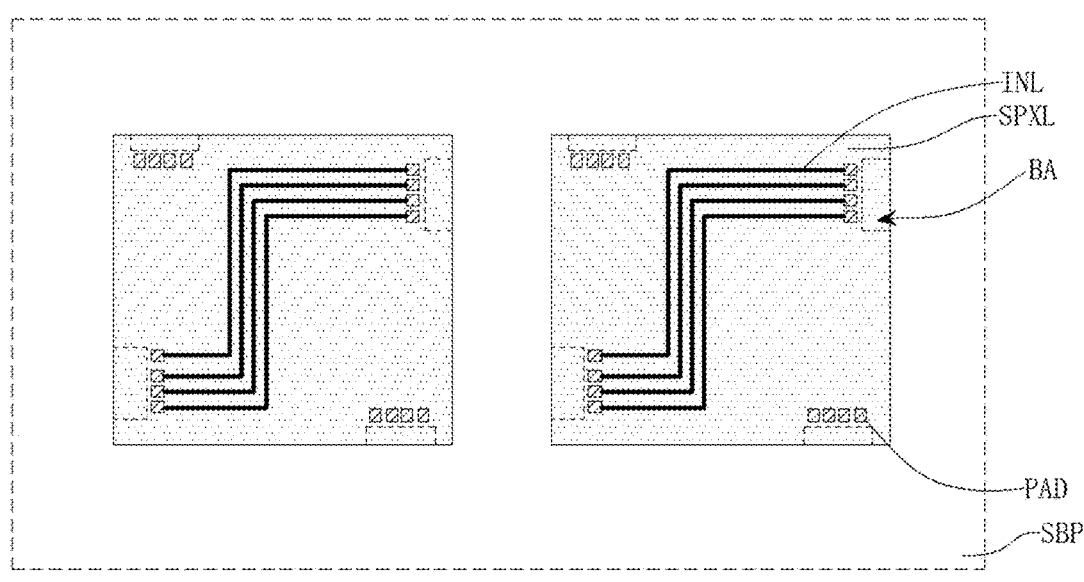
FIG. 39 is a schematic top view of preparing a display island on a support substrate in an embodiment of the present disclosure.

In one example, referring to FIG. 39, the display island SPXL is provided with a lapping area BA near the edge, and the end of the flexible base material layer FLX is lapped with the lapping area BA. Further, the connection pad PAD is outside the lapping area BA, so as to prevent the flexible base material layer FLX from covering the connection pad PAD and blocking the electrical connection between the external signal wiring OUTL and the connection pad PAD. For example, referring to FIG. 39, the lapping area BA is located between the connection pad PAD and the edge of the display island SPXL.

Figure 40:
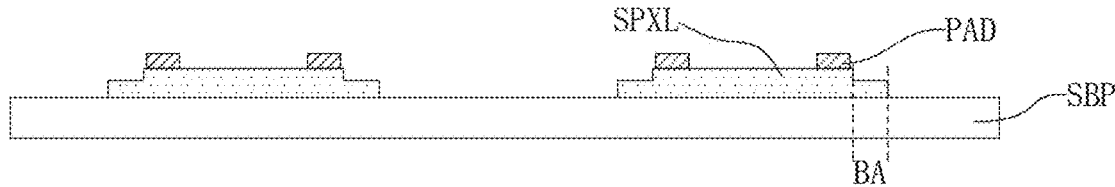
FIG. 40 is a schematic cross-sectional view of preparing a display island on a support substrate in an embodiment of the present disclosure.

In one example, referring to FIG. 40, the display island SPXL is patterned into a step shape in the lapping area BA, so that the thickness of the display island SPXL in the lapping area BA is smaller than that of the area of the display island SPXL adjacent to the lapping area BA. In other words, the distance between the surface of the adjacent area of the lapping area BA away from the surface of the elastic back film layer FBM and the elastic back film layer FBM is a first distance, and the distance between the surface of the lapping area BA away from the surface of the elastic back film layer FBM and the elastic back film layer FBM is a second distance, and the first distance is greater than the second distance. In this way, the lapping area BA of the display island SPXL and its adjacent areas are stepped and have a step difference, which can allow the flexible base material layer FLX to lap on the lapping area BA without overflowing, especially not overflowing onto the connection pads PAD, thereby avoiding the influence of the preparation of the flexible base material layer FLX on the connection pad PAD, and improving the process margin of the display panel.

Figure 49:
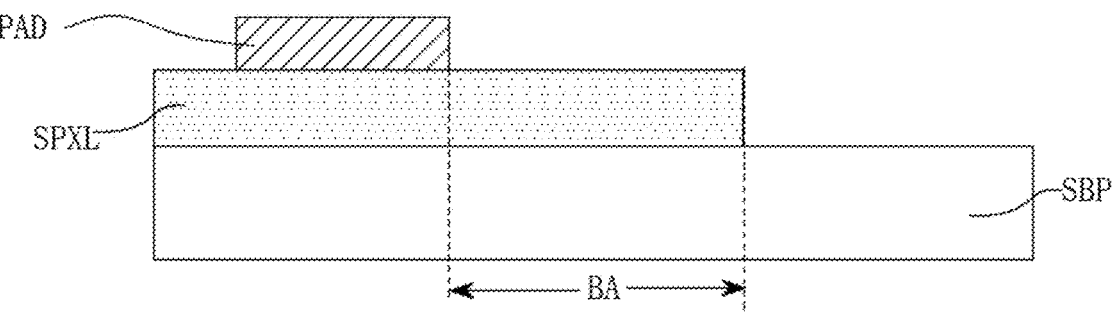
FIG. 49 is a schematic diagram of the structure of the lapping area on the display island in an embodiment of the present disclosure.
Figure 50:
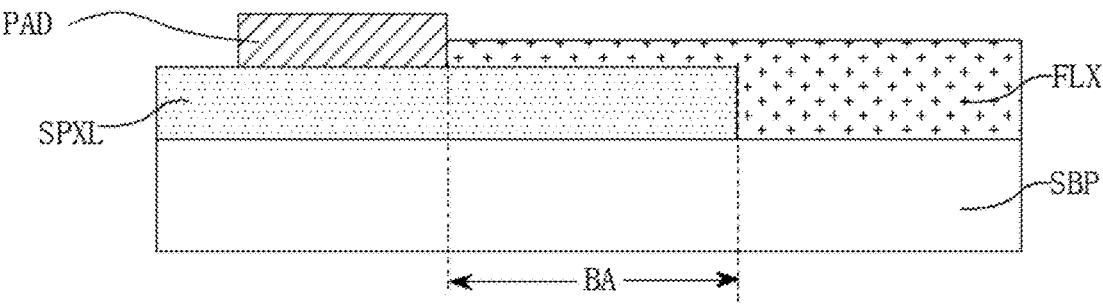
FIG. 50 is a schematic structural diagram of the lapping between the lapping area and the flexible base material layer in an embodiment of the present disclosure.

Of course, in other embodiments of the present disclosure, referring to FIG. 49 and FIG. 50, the lapping area BA may not be thinned or only slightly thinned, that is, it may not be essential to make the lapping area BA and the adjacent area necessarily have a stepped shape. By adjusting the position of the lapping area BA, especially adjusting the distance between the lapping area BA and the connection pad PAD, it can be ensured that the flexible base material layer FLX will not be lapped with the connection pad PAD when preparing the flexible base material layer FLX.

Figure 51:
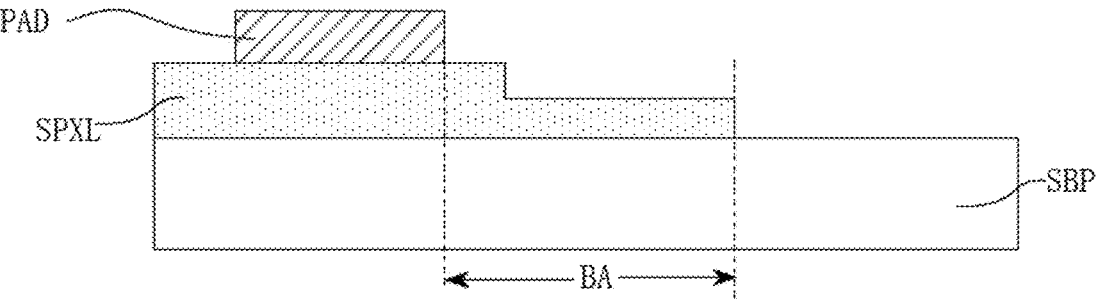
FIG. 51 is a schematic diagram of the structure of the lapping area on the display island in an embodiment of the present disclosure.
Figure 52:
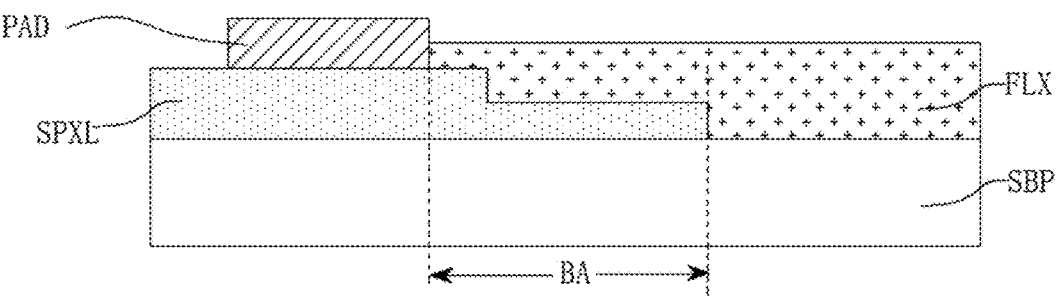
FIG. 52 is a schematic structural diagram of the lapping between the lapping area and the flexible base material layer in an embodiment of the present disclosure.
Figure 53:
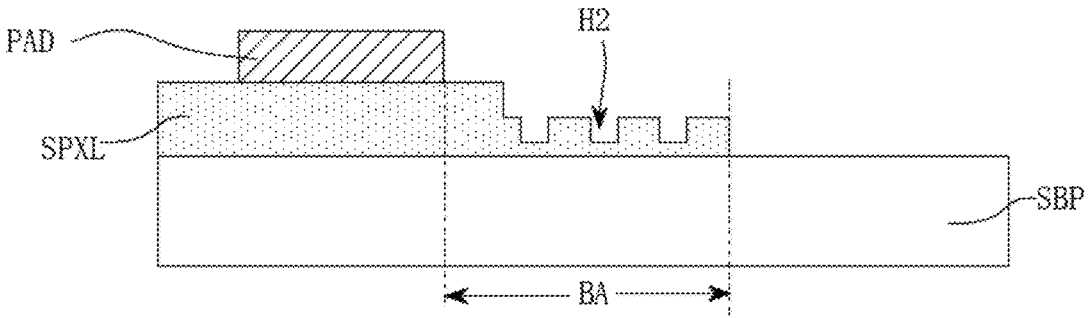
FIG. 53 is a schematic diagram of the structure of the lapping area on the display island in an embodiment of the present disclosure.
Figure 54:
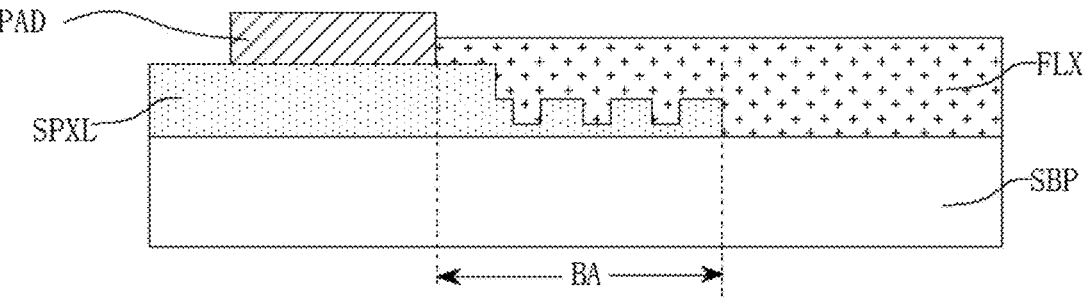
FIG. 54 is a schematic structural diagram of the lapping between the lapping area and the flexible base material layer in an embodiment of the present disclosure.
Figure 55:
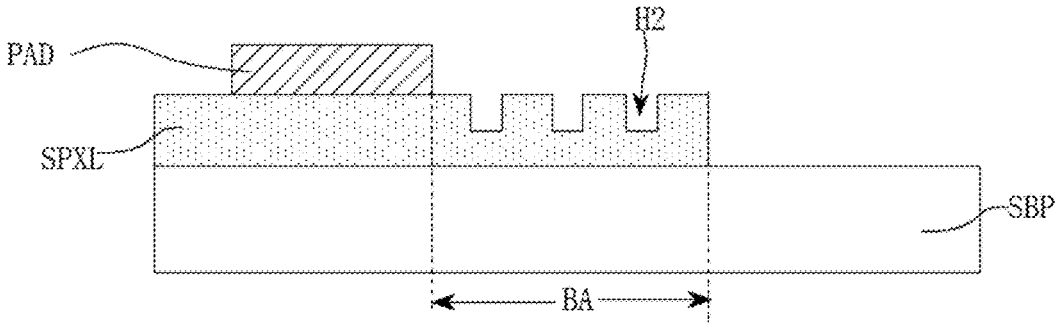
FIG. 55 is a schematic diagram of the structure of the lapping area on the display island in an embodiment of the present disclosure.
Figure 56:
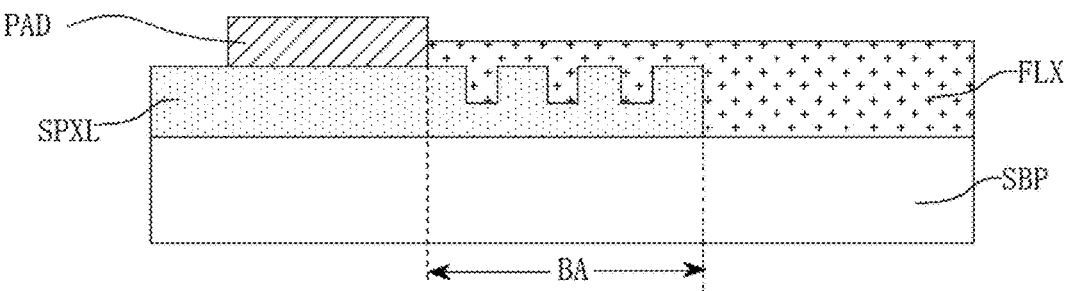
FIG. 56 is a schematic structural diagram of the lapping between the lapping area and the flexible base material layer in an embodiment of the present disclosure.

In one embodiment of the present disclosure, referring to FIG. 51 and FIG. 52, the interior of the lapping area BA can be patterned in a stepped shape to increase the attachment area between the flexible base material layer FLX and the lapping area BA, and improve the bond strength between the substrate layer FLX and the bonding area BA.

In one embodiment of the present disclosure, referring to FIG. 53 to FIG. 56, a second reinforcing hole H2 can be provided in the lapping area BA to improve the adhesion between the lapping area BA and the flexible base material layer FLX, and overcome the risk that the flexible base material layer FLX and the display island SPXL are easily detached from each other. In this way, it is possible to prevent the flexible base material layer FLX and the display island SPXL from separating from each other during the stretching process of the display panel, resulting in an increase in the stress on the external signal wiring OUTL, thereby reducing the risks of disconnection between the external signal wiring OUTL and the connection pad PAD.

In one example, referring to FIG. 53 to FIG. 56, the display island SPXL is provided with at least one second reinforcing hole H2 in the lapping area BA; the flexible base material layer FLX at least partially covers the second reinforcing hole H2. In this way, the flexible base material layer FLX can be partially snapped into the second reinforcing hole H2, which increases the adhesion between the flexible base material layer FLX and the lapping area BA, and reduces the risks of the flexible base material layer FLX peeling off from the lapping area BA. For example, referring to FIG. 53 and FIG. 54, the display island SPXL is thinned in the lapping area BA, so that there is a step between the lapping area BA and the adjacent area, or the interior of the lapping area BA is stepped, a second reinforcing hole H2 may be provided in the lapping area BA, and the flexible base material layer FLX is lapped with the lapping area BA and covers the second reinforcing hole H2. For another example, referring to FIG. 55 and FIG. 56, the display island SPXL is not thinned in the lapping area BA, a second reinforcing hole H2 may be provided in the lapping area BA, and the flexible base material layer FLX is lapped with the lapping area BA and covers the second reinforcing hole H2.

Optionally, the number of second reinforcing holes H2 in the lapping area BA may be multiple, so as to further improve the adhesion between the lapping area BA and the flexible base material layer FLX. A plurality of second reinforcing holes H2 are arranged in the lapping area BA in a regular or irregular manner. The second reinforcing hole H2 may be in the shape of a rectangle, a square, a circle, an ellipse, a triangle, a hexagon, a zigzag or other feasible shapes.

Figure 58:
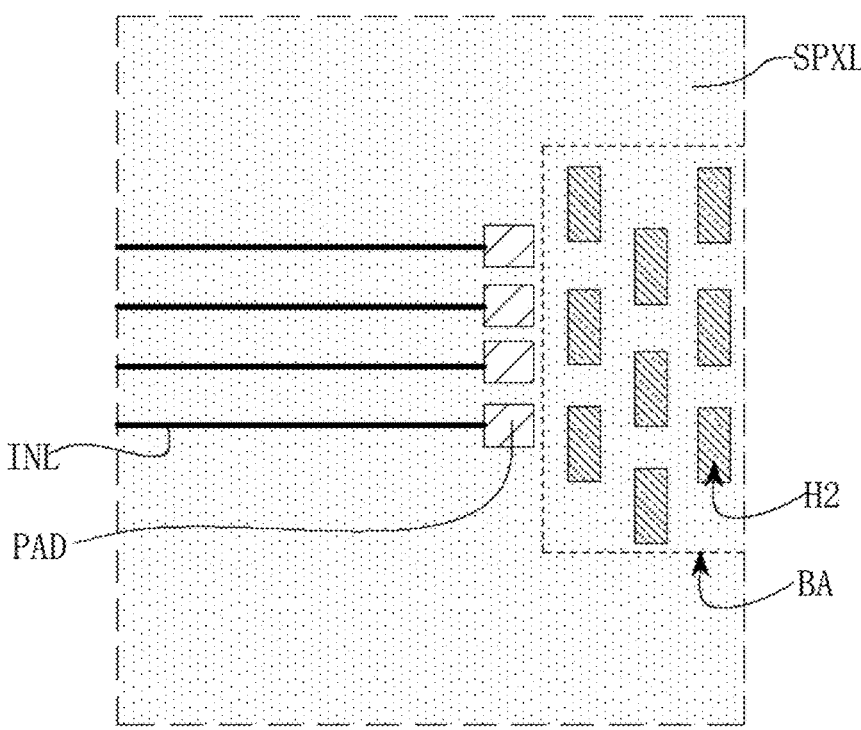
FIG. 58 is a schematic top view of the second reinforcing hole in an embodiment of the present disclosure.

As an example, referring to FIG. 58, the second reinforcing holes H2 are rectangular in shape and are multiple in number, and the extension direction of each second reinforcing hole H2 is perpendicular to the extension direction of the flexible base material layer FLX; the plurality of second reinforcing holes H2 are periodically arranged in the lapping area BA.

Figure 60:
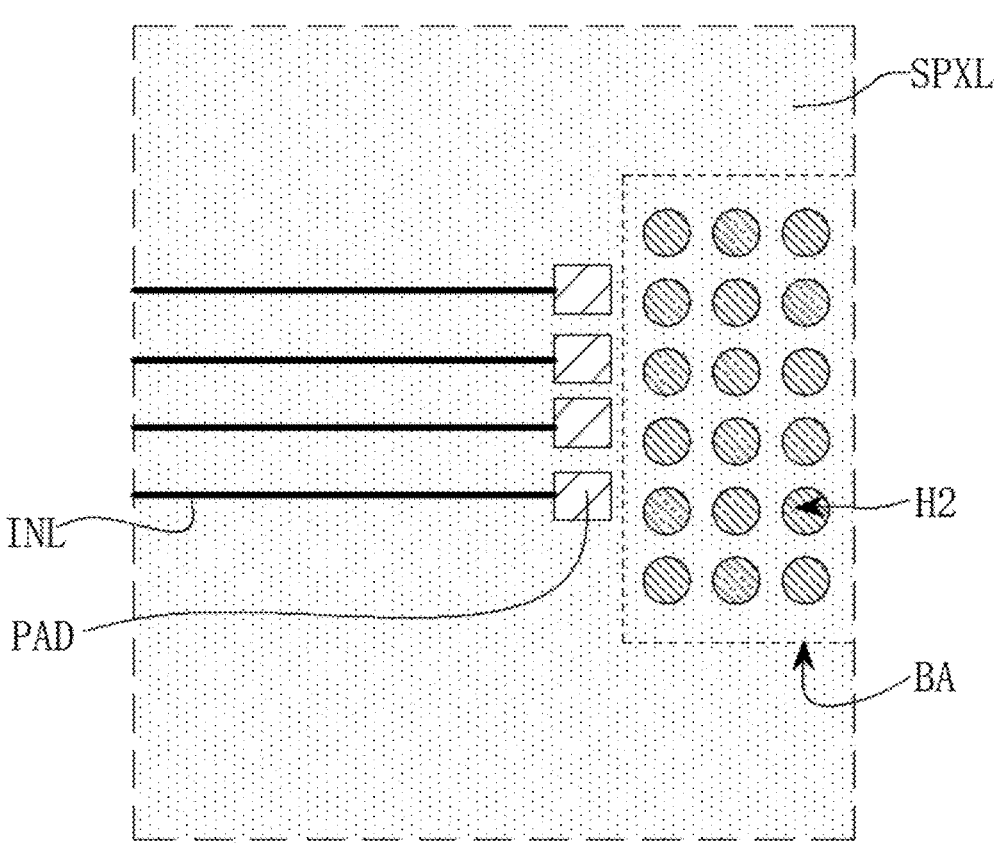
FIG. 60 is a schematic top view of the second reinforcing hole in an embodiment of the present disclosure.

As an example, referring to FIG. 60, the second reinforcing holes H2 are circular in shape and are multiple in number, and a plurality of second reinforcing holes H2 are distributed in the lapping area BA in an array.

Figure 59:
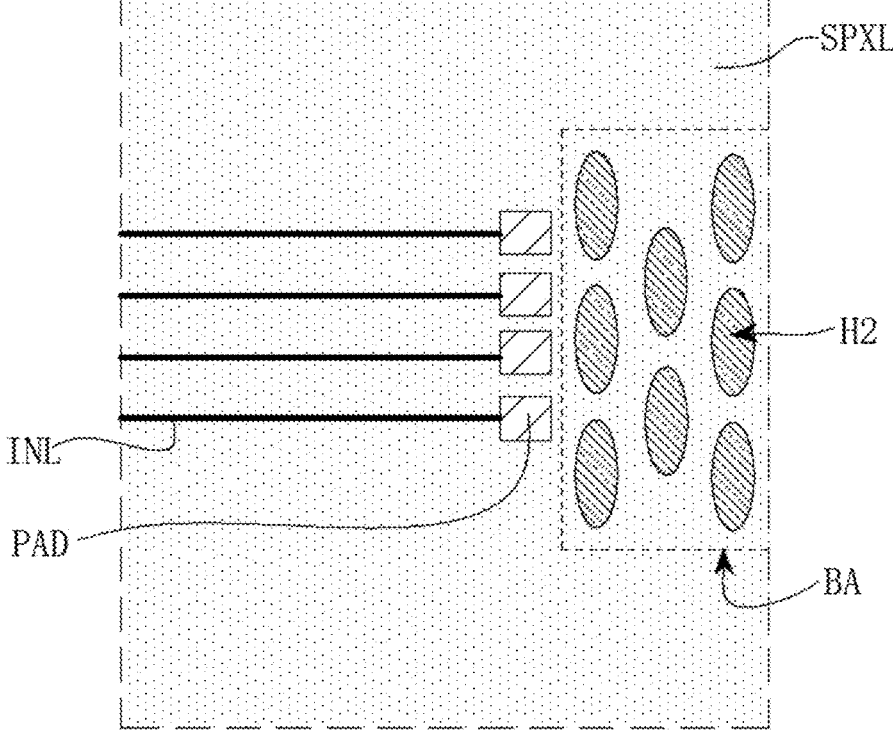
FIG. 59 is a schematic top view of a second reinforcing hole in an embodiment of the present disclosure.

As an example, referring to FIG. 59, the second reinforcing holes H2 are elliptical in shape and are multiple in number; and a plurality of second reinforcing holes H2 are distributed in the lapping area BA in an array.

Of course, in other embodiments of the present disclosure, the area adjacent to the lapping area BA may also be provided with the second reinforcing hole H2.

Figure 57:
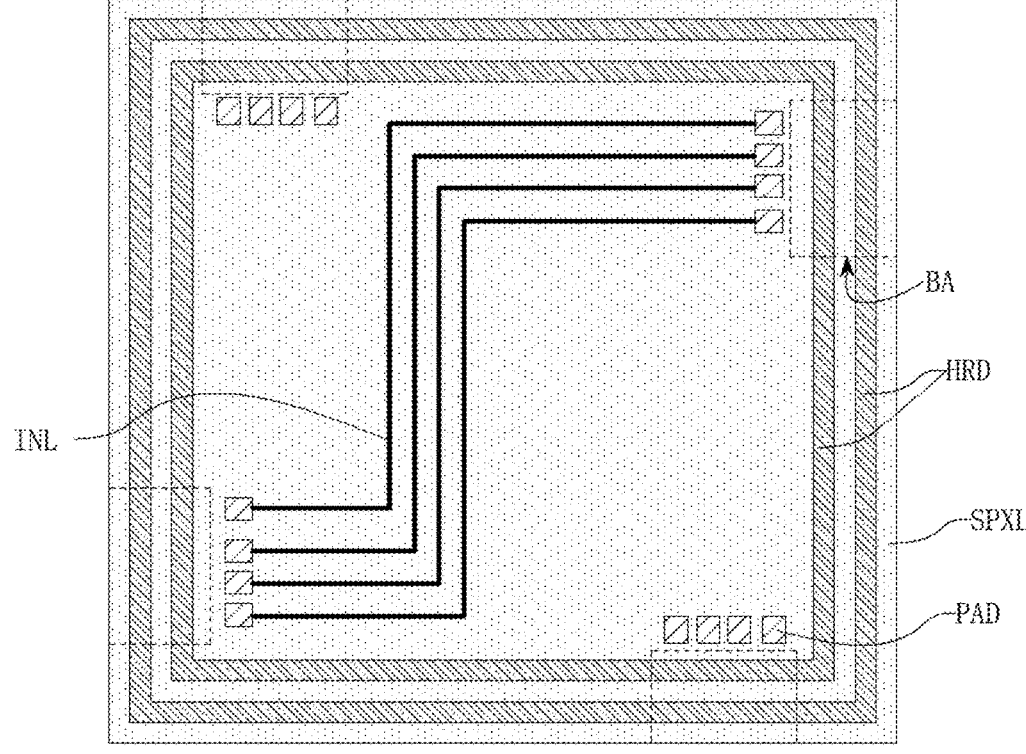
FIG. 57 is a schematic structural diagram of an annular groove on a display island in an embodiment of the present disclosure.

In one embodiment of the present disclosure, referring to FIG. 57, at least one annular groove HRD is provided along the edge of the display island SPXL; the annular groove HRD overlaps with the lapping area BA; the flexible base material layer FLX covers at least part of the annular groove HRD in the lapping area BA. In this way, the part of the annular groove HRD located in the lapping area BA can be reused as the second reinforcing hole H2 to improve the adhesion between the flexible base material layer FLX and the lapping area BA.

In one embodiment of the present disclosure, the display island SPXL includes a base substrate, a driving circuit layer, and a pixel layer that are stacked in sequence; the bridging unit SBRI includes a flexible base material layer FLX and an external signal wiring OUT that are stacked in sequence. The flexible base material layer FLX and the base substrate are bonded to the elastic back film layer FBM.

In an embodiment of the present disclosure, referring to FIG. 62, the manufacturing method shown in step S210 to step S250 can be used to prepare the display panel of the embodiment of the present disclosure.

Step S210, referring to FIG. 39 and FIG. 40, a plurality of display islands SPXL are prepared on a supporting substrate SBP. The adjacent display islands SPXL are separated from each other; the display islands SPXL have at least one display unit Upxl and an internal signal wiring INL for providing signal to the display unit Upxl; and the display island SPXL is also provided with a connection pad PAD electrically connected to the internal signal wiring INL. In this way, each display island SPXL is hollowed out (the various film layers of the display island SPXL are hollowed out, and the support substrate SBP may be not hollowed out) so that each display island SPXL is isolated from each other, that is, the space between two adjacent display islands SPXL are hollow areas. Wherein, the side of the display island SPXL away from the support substrate SBP is provided with the connection pad PAD.

Figure 42:
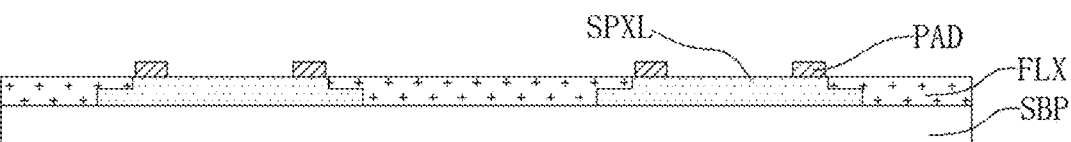
FIG. 42 is a schematic cross-sectional view of preparing a flexible base material layer between display islands in an embodiment of the present disclosure.

Step S220, referring to FIG. 41 and FIG. 42, a flexible base material layer FLX is prepared between the display islands SPXL. The flexible base material layer FLX is lapped the display islands SPXL on both sides and does not cover the connection pads PAD; and the Young's modulus of elasticity of the flexible base material layer FLX is smaller than that of the display island SPXL.

Figure 43:
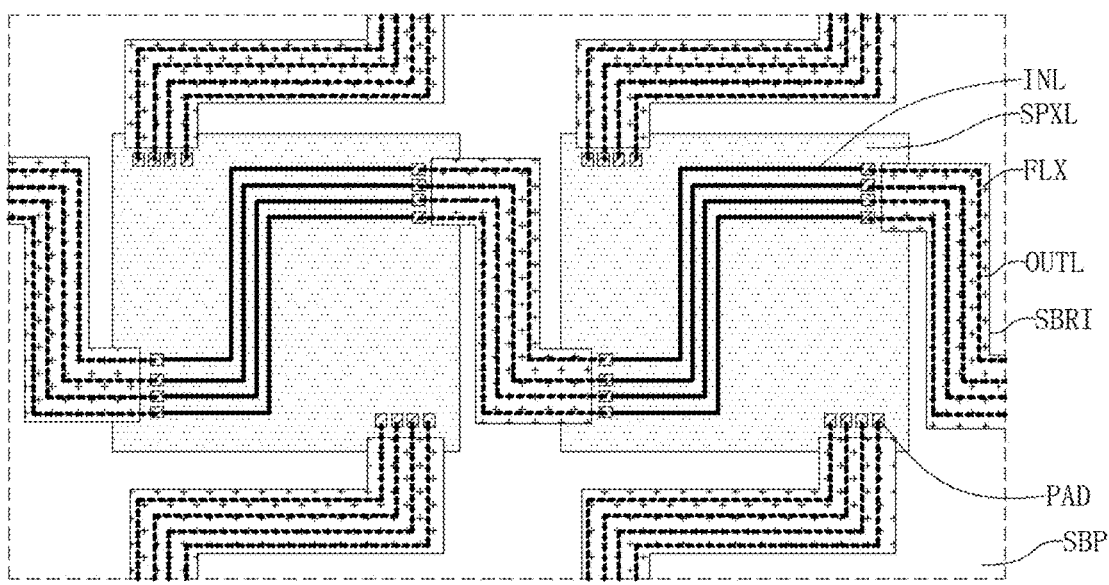
FIG. 43 is a schematic top view of preparing external signal wiring between display islands in an embodiment of the present disclosure.
Figure 44:
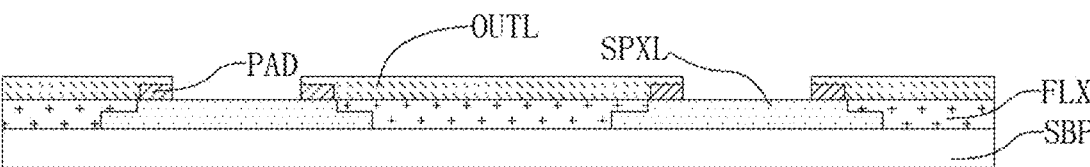
FIG. 44 is a schematic cross-sectional view of preparing external signal wiring between display islands in an embodiment of the present disclosure.

Step S230, referring to FIG. 43 and FIG. 44, an external signal wiring OUTL is provided on the flexible base material layer FLX, and the external signal wiring OUTL is lapped with the connection pads PAD of two adjacent display islands SPXL, such that the internal signal wirings INL of two adjacent display islands SPXL are electrically connected through the external signal wiring OUTL. The external signal wiring OUTL is an elastic conductor wiring. Optionally, the elastic conductor wirings serving as external signal wiring OUTL may be prepared on the flexible base material layer FLX by screen printing, printing, etching or other feasible methods.

Figure 45:
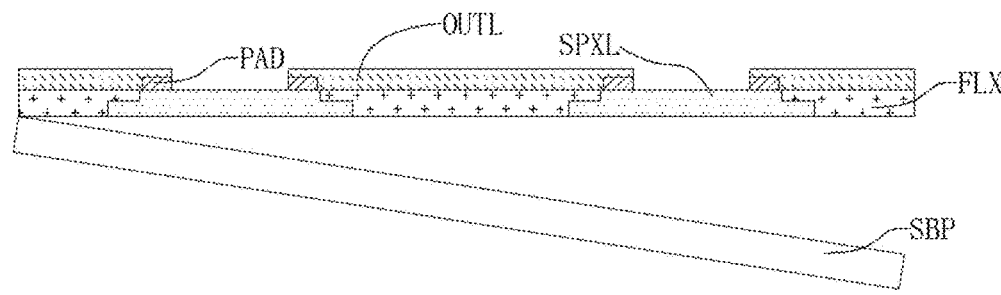
FIG. 45 is a schematic structural view of peeling off a supporting substrate in an embodiment of the present disclosure.
Figure 46:
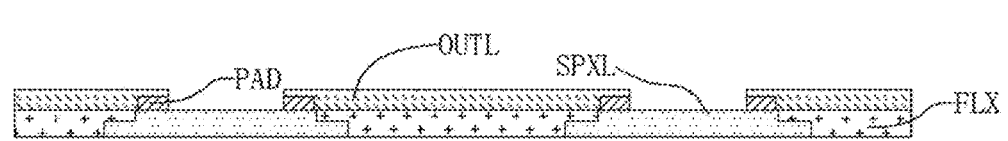
FIG. 46 is a schematic structural view of an assembly of a display island, an external signal wiring and a flexible base material layer in an embodiment of the present disclosure.

Step S240, referring to FIG. 45 and FIG. 46, the display island SPXL, the flexible base material layer FLX and the external signal wiring OUTL are peeled off from the support substrate SBP; to obtain the assembly CPX of the display island SPXL, the flexible base material layer of FLX and the external signal wiring OUTL.

Figure 47:
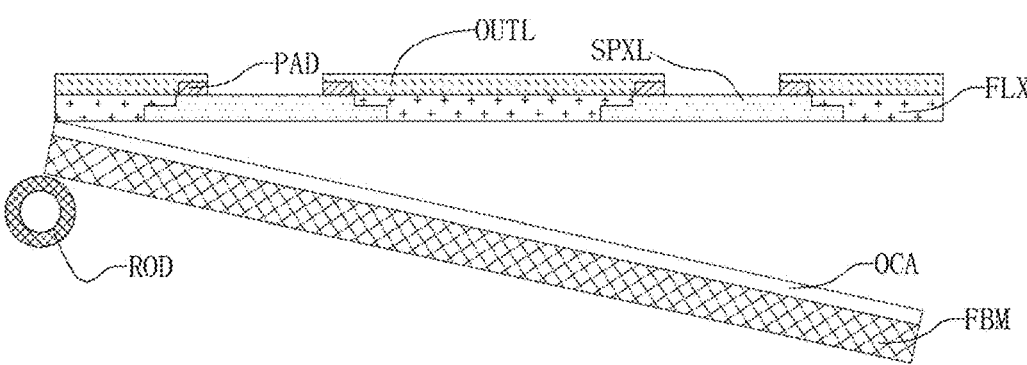
FIG. 47 is a structural schematic view of laminating the assembly of the display island, external signal wiring and flexible base material layer to the elastic back film layer in an embodiment of the present disclosure.

Step S250, referring to FIG. 47 and FIG. 48, the assembly CPX of the display island SPXL, the flexible base material layer FLX and the external signal wiring OUTL is attached to an elastic back film layer FBM. The Young's modulus of elasticity of the elastic back film layer FBM is less than the Young's modulus of elasticity of the flexible base material layer FLX. Exemplarily, the peeled assembly is attached to the elastic back film layer FBM pre-coated with an adhesive (such as optical glue), and a roller, for example, can be used to attach the composite body to the elastic back film layer FBM.

In one embodiment of the present disclosure, the display island SPXL is provided with a first reinforcing hole H1 or a protruding piece BU1 that matches with the connection pad PAD, and the lapping area BA is patterned to have a step or a second reinforcing hole H2. In this way, the bonding strength between the connection pad PAD and the external signal wiring OUTL, and the bonding strength between the flexible base material layer FLX and the lapping area BA are increased, which can more effectively prevent the bridging unit SBRI from detaching from the display island SPXL.

In one embodiment of the present disclosure, the display panel further includes an elastic protective film covering the display island SPXL and the bridging unit SBRI. In one example, the elastic protective film is disposed on a side of the pixel layer away from the base substrate.

It should be noted that although the steps of the manufacturing method of the display panel in the present disclosure are described in a specific order in the drawings, this does not require or imply that these steps must be performed in this specific order, or that all the shown steps must be performed to achieve the desired result. Additionally or alternatively, certain steps may be omitted, multiple steps may be combined into one step for execution, and/or one step may be decomposed into multiple steps for execution, etc.

Other embodiments of the present disclosure will be readily apparent to those skilled in the art from consideration of the specification and practice of the invention disclosed herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and examples are to be considered exemplary only, with the true scope and spirit of the disclosure indicated by the appended claims.

What is claimed is:

1. A display panel, comprising a plurality of display islands and a plurality of deformable bridging units, wherein the plurality of display islands are separated from each other, and two adjacent display islands are connected by the bridging units; and wherein each display island comprises at least one display unit, and each bridging unit comprises an external signal wiring electrically connected to the display unit, wherein the bridging unit is provided with at least one stress relief hole, wherein the bridging unit comprises a bending area, and wherein at least a part of the stress relief hole is disposed in the bending area, and wherein the bending area is divided into a plurality of wiring areas by the stress release hole, and the external signal wiring is arranged in each of the wiring areas;

each of the wiring regions comprises an inner edge adjacent to a concave side edge of the bending area and an outer edge adjacent to a convex side edge of the bending area; and in at least a part of the wiring area, a distance between the external signal wiring closest to the inner edge and the inner edge is greater than a distance between the external signal wiring closest to the outer edge and the outer edge.

2. The display panel according to claim 1, wherein the stress relief hole is a hollow hole; and/or wherein the stress relief hole is a circular hole, an elliptical hole or a long hole, and wherein a middle line of the long hole is parallel to a middle line of the bridging unit.

3. The display panel according to claim 2, wherein at least one of the long holes is configured to run through the bridging unit along the extending direction of the bridging unit.

4. The display panel according to claim 1, wherein at least one set of stress relief holes is provided on the bridging unit, and each set of stress relief holes comprises a plurality of stress relief holes arranged in sequence; and wherein an arrangement track of each stress relief hole in each group of stress relief holes is parallel to a middle line of the bridging unit.

5. The display panel according to claim 1, wherein the display island comprises an internal signal wiring corresponding to the external signal wiring on an adjacent bridging unit, and comprises a connection pad electrically connected to the internal signal wiring;

wherein the external signal wiring is lapped to the connection pad, so that the external signal wiring is electrically connected to the corresponding internal signal wiring; and wherein the external signal wiring is an elastic conductor wiring.

6. The display panel according to claim 5, wherein the connection pad is provided with at least one first reinforcing hole, and the external signal wiring at least partially covers the first reinforcing hole.

7. The display panel according to claim 5, wherein an inorganic medium layer is provided between the connection pad and the external signal wiring, and the inorganic medium layer is provided with a first reinforcing hole exposing at least a part region of the connection pad, and the external signal wiring is electrically connected to the connection pad through the first reinforcing hole; and wherein an adhesion between the inorganic medium layer and the connection pad is greater than an adhesion between the external signal wiring and the connection pad.

8. The display panel according to claim 5, wherein a protruding piece is provided on a surface of the connection pad close to the external signal wiring, and the external signal wiring covers the protruding piece and is electrically connected to the connection pad; and wherein an adhesion between the protruding piece and the connection pad is greater than an adhesion between the external signal wiring and the connection pad.

9. The display panel according to claim 5, wherein the bridging unit further comprises a flexible base material layer, the flexible base material layer is lapped with the display island; and the flexible base material layer is over-lapped with the external signal wiring.

10. The display panel according to claim 9, wherein the display island is provided with a lapping area at a position near an edge, and an end of the flexible base material layer is lapped on the lapping area.

11. The display panel according to claim 10, wherein the display island is thinned at the lapping area such that there is a step between the lapping area and an adjacent area.

12. The display panel according to claim 10, wherein the lapping area is located between the connection pad and the edge of the display island.

13. The display panel according to claim 10, wherein the display island is provided with a second reinforcing hole in the lapping area; and the flexible base material layer at least partially covers the second reinforcing hole.

14. The display panel according to claim 5, wherein the display panel further comprises an elastic back film layer; the display islands and the bridging units are disposed on a same side of the elastic back film layer; Young's modulus of elasticity of the elastic back film layer is smaller than Young's modulus of elasticity of the display island; and/or wherein Young's modulus of elasticity of the external signal wiring is greater than Young's modulus of elasticity of the elastic back film layer.

15. A display device, comprising a substrate and the display panel according to claim 1, and the display panel being attached to the substrate.

16. A method for manufacturing a display panel, comprising:

preparing a plurality of display islands on a support substrate, wherein adjacent display islands are separated from each other; each display island comprises at least one display unit and an internal signal wiring providing signal to the display unit; and the display island is further provided with a connection pad electrically connected to the internal signal wiring;

preparing an external signal wiring between the display islands, wherein the external signal wiring is lapped with the connection pads of adjacent two display islands, such that the internal signal wirings of the adjacent two display islands are electrically connected by the external signal wiring, and the external signal wiring is an elastic conductor wiring;

peeling off the display island and the external signal wiring from the support substrate; and bonding the display island and the external signal wiring to an elastic back film layer, and Young's modulus of elasticity of the elastic back film layer is smaller than Young's modulus of elasticity of the display island.

17. A method for manufacturing a display panel, comprising:

preparing a plurality of display islands on a support substrate, wherein adjacent display islands are separated from each other; each display island comprises at least one display unit and an internal signal wiring providing signal to the display unit; and the display island is further provided with a connection pad electrically connected to the internal signal wiring;

preparing a flexible base material layer between the display islands, wherein the flexible base material layer is lapped with the display islands at both sides while the flexible base material layer does not cover the lapping pads, and Young's modulus of elasticity of the flexible base material layer is smaller than Young's modulus of elasticity of the display island;

preparing an external signal wiring on the flexible base material layer, wherein the external signal wiring is lapped with the connection pads of adjacent two display islands, such that the internal signal wirings of the adjacent two display islands are electrically connected by the external signal wiring, and the external signal wiring is an elastic conductor wiring;

peeling off the display island, the flexible base material layer and the external signal wiring from the support substrate; and bonding the display island, the flexible base material layer and the external signal wiring to an elastic back film layer, and Young's modulus of elasticity of the elastic back film layer is smaller than Young's modulus of elasticity of the flexible base material layer.

* * * * *